(12) United States Patent
Sakui et al.

(10) Patent No.: US 12,315,563 B2
(45) Date of Patent: May 27, 2025

(54) MEMORY APPARATUS USING SEMICONDUCTOR DEVICES

(71) Applicant: Unisantis Electronics Singapore Pte. Ltd., Singapore (SG)

(72) Inventors: Koji Sakui, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 135 days.

(21) Appl. No.: 18/231,053

(22) Filed: Aug. 7, 2023

(65) Prior Publication Data
US 2023/0420044 A1 Dec. 28, 2023

Related U.S. Application Data

(63) Continuation-in-part of application No. PCT/JP2021/004738, filed on Feb. 9, 2021.

(51) Int. Cl.
*G11C 11/404* (2006.01)
*G11C 13/00* (2006.01)

(52) U.S. Cl.
CPC ........ *G11C 13/0069* (2013.01); *G11C 11/404* (2013.01); *G11C 13/0038* (2013.01); *G11C 13/0097* (2013.01)

(58) Field of Classification Search
CPC ............ G11C 13/0069; G11C 13/0038; G11C 13/0097; G11C 2211/4016;
(Continued)

(56) References Cited

U.S. PATENT DOCUMENTS

| 8,248,853 B2 * | 8/2012 | Lee ..................... G11C 16/0483 |
| | | 365/185.23 |
| 10,643,690 B2 * | 5/2020 | Kim ....................... H10B 99/22 |

(Continued)

FOREIGN PATENT DOCUMENTS

| JP | H02188966 A | 7/1990 |
| JP | H03171768 A | 7/1991 |

(Continued)

OTHER PUBLICATIONS

Written Opinion of the International Searching Authority in International Application No. PCT/JP2021/004738, dated Apr. 27, 2021 (4 pages).

(Continued)

*Primary Examiner* — Khamdan N. Alrobaie
(74) *Attorney, Agent, or Firm* — Crowell & Moring LLP

(57) ABSTRACT

A memory apparatus includes a page including a plurality of memory cells arranged in a column on a substrate. Each of voltages applied to first and second gate conductor layers and first and second impurity layers in each memory cell included in the page is controlled to perform a page write operation of retaining holes, which have been formed through an impact ionization phenomenon or using a gate induced drain leakage current, in a semiconductor base material, or each of voltages applied to the first and second gate conductor layers, third and fourth gate conductor layers, and the first and second impurity layers is controlled to perform a page erase operation of removing the holes from the semiconductor base material, and further lowering a voltage of the semiconductor base material through capacitive coupling with the first gate conductor layer and the second gate conductor layer.

10 Claims, 13 Drawing Sheets

(58) Field of Classification Search
CPC ... G11C 16/0425; G11C 16/16; G11C 11/404; G11C 16/10; H10B 12/00
See application file for complete search history.

(56) References Cited

U.S. PATENT DOCUMENTS

| | | | |
|---|---|---|---|
| 11,581,316 B2* | 2/2023 | Kim | H10D 84/138 |
| 11,823,726 B2* | 11/2023 | Sakui | G11C 16/0466 |
| 11,894,072 B2* | 2/2024 | Guo | G11C 11/5671 |
| 11,894,103 B2* | 2/2024 | Fantini | G11C 8/10 |
| 2006/0049444 A1 | 3/2006 | Shino | |
| 2008/0212366 A1 | 9/2008 | Ohsawa | |
| 2017/0330623 A1* | 11/2017 | Kim | G11C 11/5628 |
| 2018/0033792 A1* | 2/2018 | Masuoka | H10D 30/63 |
| 2022/0139437 A1* | 5/2022 | Ocker | G11C 11/221 365/145 |
| 2022/0208254 A1* | 6/2022 | Sakui | G11C 11/406 |

FOREIGN PATENT DOCUMENTS

| | | |
|---|---|---|
| JP | 2006-80280 A | 3/2006 |
| JP | H3957774 | 5/2007 |
| JP | 2008-218556 | 9/2008 |

OTHER PUBLICATIONS

Takato, H., et al., "Impact of Surrounding Gate Transistor (SGT) for Ultra-High-Density LSI's", IEEE Transactions on Electron Devices, vol. 38, No. 3, Mar. 1991, pp. 573-578 (6 pages).

Chung, H., et al., "Novel 4F2 DRAM Cell with Vertical Pillar Transistor(VPT)" *2011 Proceedings of the European Solid-State Device Research Conference* (2011) (4 pages).

Wong, H.S., P., et al., "Phase Change Memory" *Proceedings of the IEEE*, vol. 98, No. 12, Dec. 2010, pp. 2201-2227 (27 pages).

Tsunoda, K., et al., "Low Power and High Speed Switching of Ti-doped NiO ReRAM under the Unipolar Voltage Source of less than 3 V" IEDM (2007) pp. 767-770, (4 pages).

Kang, W., et al., "Reconfigurable Codesign of STT-MRAM Under Process Variations in Deeply Scaled Technology" *IEEE Transactions on Electron Devices*, vol. 62, No. 6, Jun. 2015, pp. 1769-1777 (9 pages).

Ertosun, M. G., et al., "Novel Capacitorless Single-Transistor Charge-Trap DRAM 1T CT DRAM) Utilizing Electrons" *IEEE Electron Device Letters*, vol. 31, No. 5, May 2010, pp. 405-407 (3 pages).

Wan, J., et al., "A Compact Capacitor-Less High-Speed DRAM Using Field Effect-Controlled Charge Regeneration" *IEEE Electron Device Letters*, vol. 33, No. 2, Feb. 2012, pp. 179-181 (3 pages).

Ohsawa, T., et al., "Memory Design Using a One-Transistor Gain Cell on SOI", *IEEE Journal of Solid-State Circuits*, vol. 37, No. 11, Nov. 2022, pp. 1510-1522 (13 pages).

Shino, T., et al., "Floating Body RAM Technology and its Scalability to 32nm Node and Beyond", IEEE IEDM (2006) (4 pages).

Yoshida, E., et al., "A Design of a Capacitorless 1T-DRAM Cell Using Gate-induced Drain Leakage (GIDL) Current for Low-power and High-speed Embedded Memory" IEEE IEDM, pp. 913-916, Dec. 2003 (4 pages).

Song, J., et al., "Design Optimization of Gate-All-Around (GAA) MOSFETs" *IEEE Transactions on Nanotechnology*, vol. 5, No. 3, pp. 186-191, May 2006 (7 pages).

Loubet, N., et al., "Stacked Nanosheet Gate-All-Around Transistor to Enable Scaling Beyond FinFET" *2017 Symposium on VLSI Technology Digest of Technical Papers*, T230-T231, Jun. 2017 (2 pages).

Jiang, H., et al., "Experimental Investigation of Self-Heating Effect (SHE) in Multiple-Fin SOI FinFETS" *Semicond. Sci. Technol.* 29 (2014) 115021 (9 pages).

Yoshida, E., et al., "A Capacitorless 1T-DRAM Technology Using Gate-Induced Drain-Leakage (GIDL) Current for Low-Power and High-Speed Embedded Memory" *IEEE Transactions on Electron Devices*, vol. 53, No. 4, Apr. 2006 (6 pages).

* cited by examiner $C_{FB} = C_{WL} + C_{PL} + C_{BL} + C_{SL}$   (1)

$\beta_{WL} = \dfrac{C_{WL}}{C_{WL} + C_{PL} + C_{BL} + C_{SL}}$ ⇨ SMALL   (2)

$\beta_{PL} = \dfrac{C_{PL}}{C_{WL} + C_{PL} + C_{BL} + C_{SL}}$ ⇨ LARGE   (3)

$\beta_{BL} = \dfrac{C_{BL}}{C_{WL} + C_{PL} + C_{BL} + C_{SL}}$ ⇨ SMALL   (4)

$\beta_{SL} = \dfrac{C_{SL}}{C_{WL} + C_{PL} + C_{BL} + C_{SL}}$ ⇨ SMALL   (5)

$\Delta V_{FB} = V_{FBH} - V_{FBL} = \beta_{WL} \times V_{WLH}$ ⇨ SMALL   (6)

$$V_{FB}"1" = V_b - \beta_{WL} \times Vt_{WL}"1" - \beta_{BL} \times V_{BLH} \quad (7)$$

SMALL

FIG. 3AA "1" PAGE WRITE OPERATION
SOURCE-SIDE IMPACT IONIZATION

FIG. 3AC "1" WRITTEN STATE

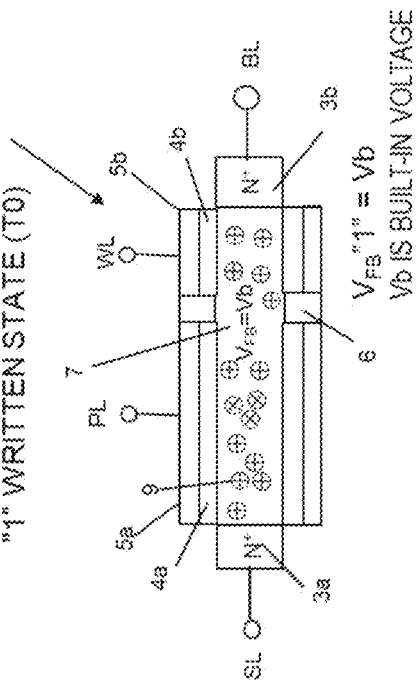

FIG. 4BA TIMING CHART OF "0" PAGE ERASE OPERATION

T3 TO T4: FIRST PERIOD
T5 TO T6: SECOND PERIOD
T9 TO T10: THIRD PERIOD

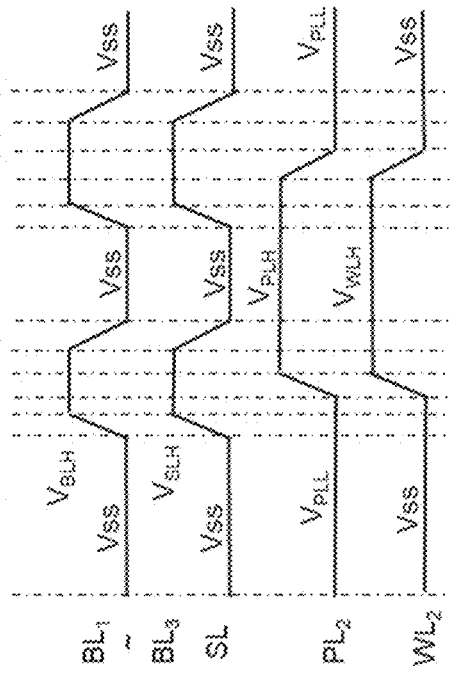

FIG. 4BC DURING "0" ERASE OPERATION, HOLES 9 ARE DISCHARGED (T5 TO T6)

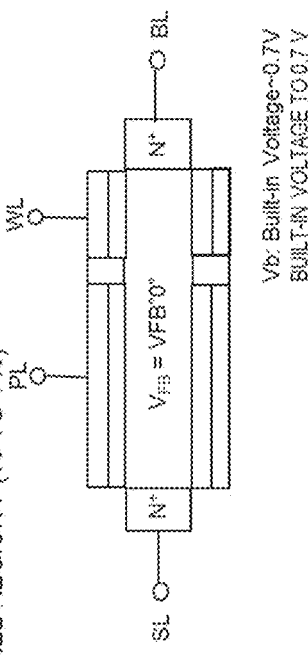

FIG. 4BB "1" WRITTEN STATE (T0)

$V_{FB} \text{"1"} = Vb$
Vb IS BUILT-IN VOLTAGE $V_{FB} \text{"1"} = Vb - \beta_{WL} \times Vt_{WL} \text{"1"}$   (7)

$V_{FB} \text{"0"} = Vb - \beta_{WL} \times V_{WLH} - \beta_{PL} \times (V_{PLH} - V_{PLL})$   (8)

$\Delta V_{FB} = V_{FB} \text{"1"} - V_{FB} \text{"0"}$
$= \beta_{WL} \times V_{WLH} + \beta_{PL} \times (V_{PLH} - V_{PLL})$
$\quad - \beta_{WL} \times Vt_{WL} \text{"1"} - \beta_{BL} \times Vb$   (9)

FIG. 4BD DURING "0" ERASE OPERATION, WORD LINE WL AND PLATE LINE PL ARE CAPACITIVELY COUPLED TO CHANNEL REGION 7 (T9 TO T10)

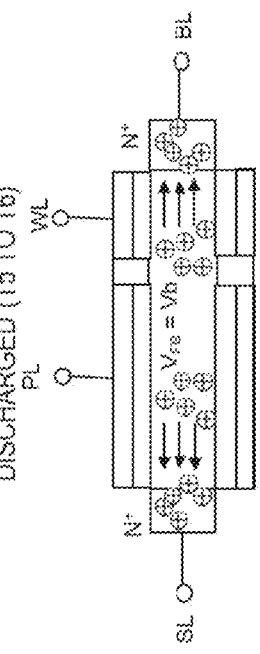

Vb: Built-in Voltage~0.7V
BUILT-IN VOLTAGE TO 0.7 V

FIG. 4DA   TIMING CHART OF "0" PAGE ERASE OPERATION

FIG. 4DB   "1" WRITTEN STATE (T0)

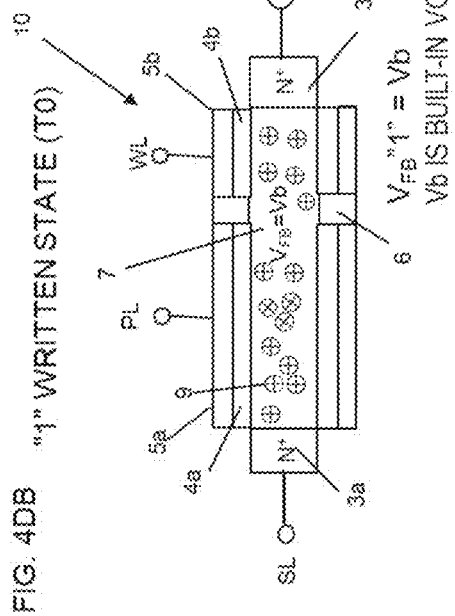

$$V_{FB} \text{"1"} = Vb$$
$$Vb \text{ IS BUILT-IN VOLTAGE}$$

$$V_{FB}\text{"1"} = Vb - \beta_{WL} \times Vt_{WL}\text{"1"} - \beta_{BL} \times V_{BLH} \quad (7)$$

$$V_{FB}\text{"0"} = Vb - \beta_{WL} \times V_{WLH} - \beta_{PL} \times (V_{PLH} - V_{PLL}) \quad (8)$$

$$\Delta V_{FB} = V_{FB}\text{"1"} - V_{FB}\text{"0"}$$
$$= \beta_{WL} \times V_{WLH} + \beta_{PL} \times (V_{PLH} - V_{PLL})$$
$$- \beta_{WL} \times Vt_{WL}\text{"1"} - \beta_{BL} \times V_{BLH} \quad (9)$$

FIG. 4DD  DURING "0" ERASE OPERATION, WORD LINE WL AND PLATE LINE PL ARE CAPACITIVELY COUPLED TO CHANNEL REGION 7 (T9 TO T10)

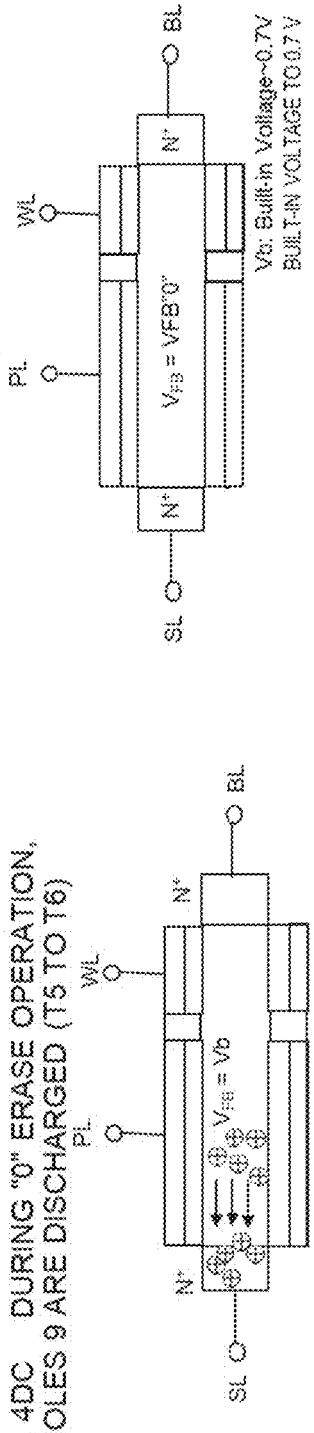

$V_{FB} = V_{FB}\text{"0"}$

Vb: Built-in Voltage~0.7V
BUILT-IN VOLTAGE TO 0.7 V

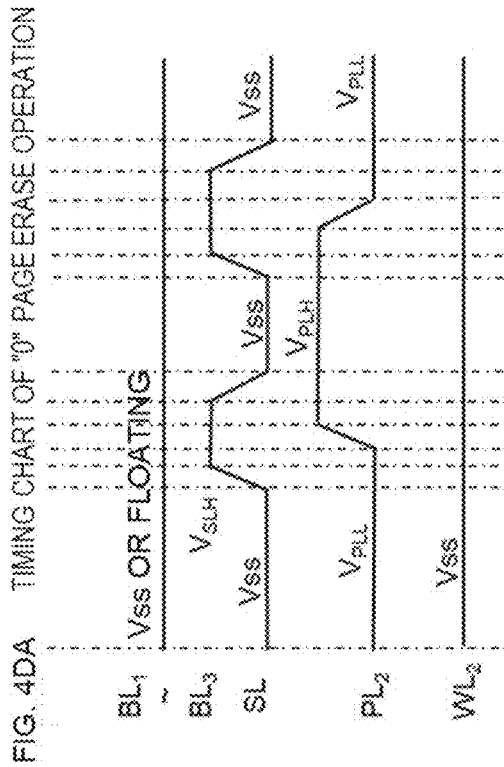

T3 TO T4: FIRST PERIOD
T5 TO T6: SECOND PERIOD
T9 TO T10: THIRD PERIOD

FIG. 4DC  DURING "0" ERASE OPERATION, HOLES 9 ARE DISCHARGED (T5 TO T6)

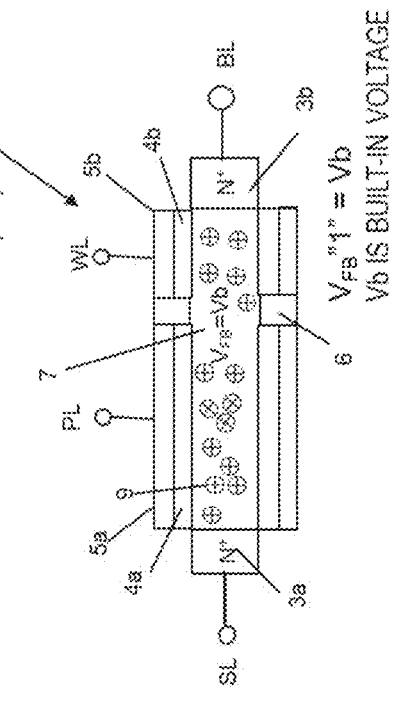

FIG. 4EA TIMING CHART OF "0" PAGE ERASE OPERATION

T3 TO T4: FIRST PERIOD
T5 TO T6: SECOND PERIOD
T9 TO T10: THIRD PERIOD

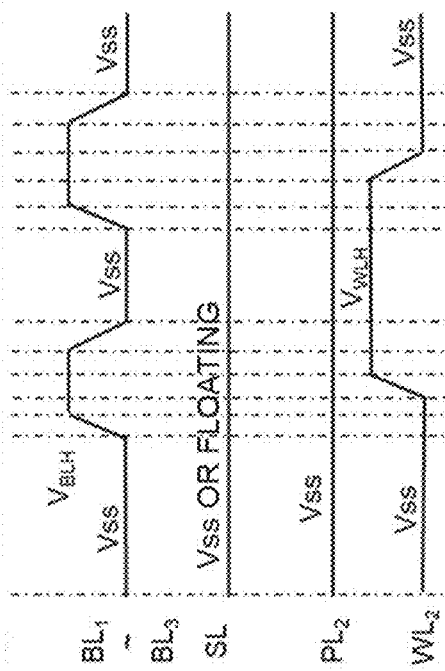

FIG. 4EC DURING "0" ERASE OPERATION, HOLES 9 ARE DISCHARGED (T5 TO T6)

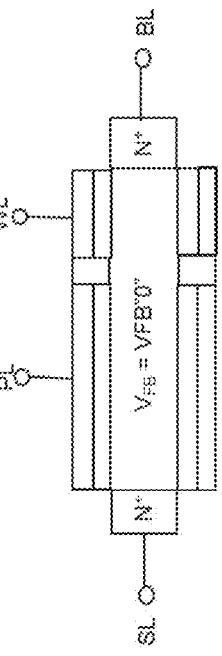

FIG. 4EB "1" WRITTEN STATE (T0)

$$V_{FB}\text{"1"} = Vb \quad (7)$$
$$V_{FB}\text{"0"} = Vb - \beta_{WL} \times V_{WLH} - \beta_{BL} \times V_{BLH} \quad (8)$$

Vb IS BUILT-IN VOLTAGE $$\Delta V_{FB} = V_{FB}\text{"1"} - V_{FB}\text{"0"}$$
$$= \beta_{WL} \times V_{WLH} + \beta_{PL} \times (V_{PLH} - V_{PLL})$$
$$- \beta_{WL} \times V_{WL}\text{"1"} - \beta_{BL} \times V_{BLH} \quad (9)$$

FIG. 4ED DURING "0" ERASE OPERATION, WORD LINE WL AND PLATE LINE PL ARE CAPACITIVELY COUPLED TO CHANNEL REGION 7 (T9 TO T10)

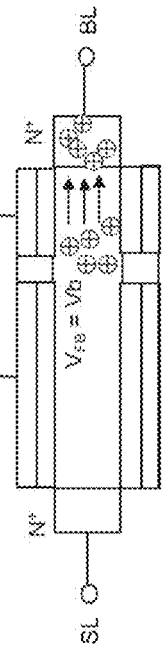

Vb: Built-in Voltage~0.7V
BUILT-IN VOLTAGE TO 0.7 V

FIG. 5A  "1" WRITTEN STATE

FIG. 5B  "0" ERASE STATE

Vb: BUILT-IN VOLTAGE TO 0.7 V $$C_{FB} = C_{WL} + C_{BL} + C_{SL} \quad (10)$$

$$\beta_{WL} = \frac{C_{WL}}{C_{WL} + C_{BL} + C_{SL}} \quad (11)$$

$$\Delta V_{FB} = V_{FB2} - V_{FB1}$$
$$= \beta_{WL} \times V_{WLH} \quad (12)$$

MEMORY APPARATUS USING SEMICONDUCTOR DEVICES

INCORPORATION BY REFERENCE

The present application is a Continuation-In-Part application of PCT/JP2021/004738, filed Feb. 9, 2021, the entire contents of which are incorporated herein by reference.

BACKGROUND OF THE INVENTION

Field of the Invention

The present invention relates to a semiconductor memory apparatus using semiconductor devices.

Description of the Related Art

In recent years, a higher degree of integration and higher performance of memory devices have been demanded in the development of the LSI (Large Scale Integration) technology.

In a common planar MOS transistor, a channel extends in the horizontal direction along the upper surface of a semiconductor substrate. In contrast, a channel of a SGT extends in a direction perpendicular to the upper surface of a semiconductor substrate (for example, see Japanese Patent Laid-Open No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). Therefore, when SGTs are used, the density of a semiconductor apparatus can be increased more than when planar MOS transistors are used. Using such SGTs as selection transistors can achieve a high degree of integration of, for example, DRAM (Dynamic Random Access Memory) with a capacitor connected thereto (for example, see H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)," 2011 Proceeding of the European Solid-State Device Research Conference, (2011)), PCM (Phase Change Memory) with a variable resistance element connected thereto (for example, see H. S. Philip Wong, S. Raoux, S. Kim, Jiale Liang, J. R. Reifenberg, B. Rajendran, M. Asheghi and K. E. Goodson: "Phase Change Memory," Proceeding of IEEE, Vol. 98, No 12, December, pp. 2201-2227 (2010)), RRAM (Resistive Random Access Memory; for example, see T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3 V," IEDM (2007)), and MRAM (Magneto-resistive Random Access Memory) whose resistance is changed by changing the direction of a magnetic spin using a current (for example, see W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015)). There is also known a capacitorless DRAM memory cell including a single MOS transistor (see Japanese Patent Laid-Open No. 3-171768 and J. Wan, L. Rojer, A. Zaslavski, and S. Critoloveanu: "A Compact Capacitor-Less High-Speed DRAM Using Field Effect-Controlled Charge Regeneration," Electron Device Letters, Vol. 35, No. 2, pp. 179-181 (2012)), for example. The present application relates to dynamic flash memory that can be formed with only a MOS transistor and without a variable resistance element or a capacitor.

FIGS. 6A, 6B, 6C and 6D illustrate a write operation for the aforementioned capacitorless DRAM memory cell including a single MOS transistor, FIGS. 7A and 7B illustrate problems with the operation thereof, and FIGS. 8A, 8B and 8C illustrate a read operation (see J. Wan, L. Rojer, A. Zaslavsky, and S. Critoloveanu: "A Compact Capacitor-Less High-Speed DRAM Using Field Effect-Controlled Charge Regeneration," Electron Device Letters, Vol. 35, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond," IEEE IEDM (2006), and E. Yoshida: "A Capacitorless 1T-DRAM Technology Using Gate-induced Drain-Leakage (GIDL) Current for Low-power and High-speed Embedded Memory," IEEE IEDM (2006)). FIG. 6A illustrates a "1" written state. Herein, the memory cell includes a source $N^+$ layer 103 (hereinafter, a semiconductor region containing a high concentration of donor impurities shall be referred to as an "$N^+$ layer") connecting to a source line SL and a drain $N^+$ layer 104 connecting to a bit line BL, each formed in a SOI substrate 100; a gate conductive layer 105 connecting to a word line WL; and a floating body 102 of a MOS transistor 110. The DRAM memory cell does not include a capacitor, and is formed with a single MOS transistor 110. It should be noted that the floating body 102 is in contact with a $SiO_2$ layer 101 of the SOI substrate immediately below the floating body 102. When "1" is written to such a memory cell including a single MOS transistor 110, the MOS transistor 110 is operated in the saturation region. That is, a channel 107 for electrons extending from the source $N^4$ layer 103 has a pinch-off point 108, and thus does not reach the drain $N^+$ layer 104 connecting to the bit line. When the MOS transistor 110 is operated while each of the bit line BL connected to the drain $N^+$ layer and the word line WL connected to the gate conductive layer 105 is set at a high voltage and the gate voltage is set at a level of about ½ that of the drain voltage, the intensity of an electric field becomes maximum at the pinch-off point 108 around the drain $N^+$ layer 104. Consequently, accelerated electrons flowing from the source $N^+$ layer 103 to the drain $N^+$ layer 104 collide with Si lattices, and electron-hole pairs are generated due to the kinetic energy lost during the collision (i.e., an impact ionization phenomenon). Most of the generated electrons (not illustrated) reach the drain $N^+$ layer 104. Meanwhile, only some of the electrons that are very hot reach the gate conductive layer 105 beyond a gate oxide film 109. In addition, holes 106 generated at the same time charge the floating body 102. In such a case, since the floating body 102 is p-type Si, the generated holes contribute to increasing the majority carriers. When the floating body 102 is filled with the generated holes 106 and the voltage of the floating body 102 becomes higher than that of the source $N^+$ layer 103, specifically, Vb or greater, the generated holes are further released to the source $N^+$ layer 103. Herein, Vb is the built-in voltage of a P-N junction between the source $N^+$ layer 103 and the floating body 102 as the P-layer, and is about 0.7 V. FIG. 6B illustrates a view in which the floating body 102 is saturated with and charged with the generated holes 106.

Next, an operation of writing "0" to the memory cell 110 will be described with reference to FIG. 6C. With respect to a common selected word line WL, there randomly exist memory cells 110 to which "1" is written and memory cells 110 to which "0" is written. FIG. 6C illustrates a view in which the state of the memory cell 110 changes from the "1" written state to the "0" written state. When "0" is written, the bit line BL is set at a negative bias voltage so that a P-N junction between the drain N⁺ layer 104 and the floating body 102 as the P-layer is forward-biased. Consequently, the holes 106, which have been generated in the floating body 102 in advance in the previous cycle, flow to the drain N⁺ layer 104 connected to the bit line BL. When the write operation is complete, two states of the memory cells are obtained that include the memory cells 110 filled with the generated holes 106 (FIG. 6B) and the memory cells 110 from which the generated holes have been discharged (FIG. 6C). The potential of the floating body 102 in the memory cell 110 filled with the holes 106 is higher than that of the floating body 102 without holes generated therein. Thus, the threshold voltage of the memory cell 110 to which "1" is written is lower than the threshold voltage of the memory cell 110 to which "0" is written. FIG. 6D illustrates such a state.

Next, problems with the operation of such a memory cell including a single MOS transistor 110 will be described with reference to FIGS. 7A and 7B. As illustrated in FIG. 7A, the capacitance $C_{FB}$ of the floating body is equal to the sum of the capacitance $C_{WL}$ between the gate connecting to the word line and the floating body, the junction capacitance $C_{SL}$ of the P-N junction between the source N⁺ layer 103 connecting to the source line and the floating body 102, and the junction capacitance $C_{BL}$ of the P-N junction between the drain N⁺ layer 104 connecting to the bit line and the floating body 102, and is represented as follows.

$$C_{FB}=C_{WL}+C_{BL}+C_{SL} \quad (10)$$

In addition, the capacitive coupling ratio $\beta_{WL}$ between the gate connecting to the word line and the floating body is represented as follows.

$$\beta_{WL}=C_{WL}/(C_{WL}+C_{BL}+C_{SL}) \quad (11)$$

Thus, when the voltage $V_{WL}$ of the word line oscillates during reading or writing, the voltage of the floating body 102 as a storage node (i.e., a node) of the memory cell is also influenced. FIG. 7B illustrates such a state. When the voltage $V_{WL}$ of the word line changes from 0 V to $V_{WLH}$ during reading or writing, the voltage $V_{FB}$ of the floating body 102 rises from the voltage $V_{FB1}$ in the initial state before the voltage of the word line has changed to $V_{FB2}$ due to capacitive coupling with the word line. The amount of change in the voltage $\Delta V_{FB}$ is represented as follows.

$$\Delta V_{FB}=V_{FB2}-V_{FB1}=\beta_{WL}\times V_{WLH} \quad (12)$$

Herein, regarding $\beta_{WL}$ in Expression (11), the contribution rate of $C_{WL}$ is large, and, for example, $C_{WL}:C_{BL}:C_{SL}$=8:1:1. In such a case, $\beta_{WL}$=0.8. When the voltage of the word line has changed from 5 V during writing to 0 V at the completion of the writing, for example, the floating body 102 receives oscillation noise with 5 V×$\beta_{WL}$=4 V due to the capacitive coupling between the word line WL and the floating body 102. Therefore, there has been a problem in that a sufficient margin cannot be provided for the potential difference between the potentials of the floating body 102 when "1" is written thereto and "0" is written thereto.

FIGS. 8A, 8B and 8C illustrate a read operation; specifically, FIG. 8A illustrates a "1" written state and FIG. 8B illustrates a "0" written state. However, in practice, even when Vb has been written to the floating body 102 during writing of "1," the floating body 102 is negative-biased once the voltage of the word line returns to 0 V at the completion of the writing. When "0" is written, the floating body 102 is negative-biased further deeply. Thus, as illustrated in FIG. 8C, it would be impossible to provide a sufficient margin for the potential difference between when "1" is written and when "0" is written. Thus, it has been practically difficult to commercialize capacitorless DRAM memory cells.

SUMMARY OF THE INVENTION

Technical Problem

A capacitorless single-transistor DRAM (i.e., a gain cell) involves strong capacitive coupling between a word line and a floating body, and thus has a problem in that when the potential of the word line is oscillated during data reading or data writing, the oscillation is directly transmitted as noise to the floating body. Consequently, problems, such as erroneous reading and erroneous rewriting of memory data, occur, making it difficult to put the capacitorless single-transistor DRAM (i.e., the gain cell) into practical use.

Solution to the Problem

To solve the foregoing problems, a memory apparatus using semiconductor devices of the present invention includes a page including a plurality of memory cells arranged in a column on a substrate, in which each memory cell included in the page has a semiconductor base material provided on the substrate in a manner standing in an upright position along a vertical direction or extending in a horizontal direction with respect to the substrate, a first impurity region and a second impurity region at opposite ends of the semiconductor base material, a gate insulating layer in contact with a side face of the semiconductor base material between the first impurity region and the second impurity region, a first gate conductor layer partially or entirely covering the gate insulating layer, and a second gate conductor layer adjacent to the first gate conductor layer and in contact with a side face of the gate insulating layer, in each of the individual memory cells, each of voltages applied to the first gate conductor layer, the second gate conductor layer, the first impurity region, and the second impurity region is controlled to allow holes generated through an impact ionization phenomenon or using a gate induced drain leakage current to be retained in the semiconductor base material, and during a page write operation, a voltage of the semiconductor base material is set to a first data holding voltage that is higher than one or both of a voltage of the first impurity region and a voltage of the second impurity region, and in all of the individual memory cells forming the page, during a page erase operation, the voltage of the semiconductor base material is controlled to a voltage higher than the first data holding voltage through one or both of first capacitive coupling between the first gate conductor layer and the semiconductor base material and second capacitive coupling between the second gate conductor layer and the semiconductor base material, and until the voltage of the semiconductor base material has become higher than one or both of the voltage of the first impurity region and the voltage of the second impurity region, the holes are removed from the semiconductor base material through one or both of the first impurity region and the second impurity region, and the voltage of the semiconductor base material is set to a second data holding voltage lower than the first data holding voltage through the first capacitive coupling and the second capacitive coupling (first invention).

In the foregoing first invention, during the page erase operation, a voltage of the first gate conductor layer is changed from a first voltage to a second voltage higher than the first voltage, or a voltage of the second gate conductor layer is changed from a third voltage to a fourth voltage higher than the third voltage, in a first period, the voltage of the semiconductor base material is controlled to a voltage higher than the first data holding voltage through the first capacitive coupling and the second capacitive coupling, in a second period, the holes are pulled out from the semiconductor base material through one or both of the first impurity region and the second impurity region until the voltage of the semiconductor base material has become higher than one or both of the voltage of the first impurity region and the voltage of the second impurity region by a built-in voltage, and in a third period, the voltage of the semiconductor base material is set to the second data holding voltage lower than the first data holding voltage through the first capacitive coupling and the second capacitive coupling (second invention).

In the foregoing first invention, when the page erase operation is performed on the page including the plurality of semiconductor base materials arranged in a column, the page erase operation is concurrently performed on all of the semiconductor base materials included in the page (third invention).

In the foregoing first invention, an inversion layer is not formed in the semiconductor base material in a part of or an entirety of the first period and the second period in which the voltage of the semiconductor base material is changed using one or both of the first capacitive coupling and the second capacitive coupling based on voltages applied to the first impurity region and the second impurity region (fourth invention).

In the foregoing first invention, a first gate capacitance between the first gate conductor layer and the semiconductor base material is set larger than a second gate capacitance between the second gate conductor layer and the semiconductor base material (fifth invention).

In the foregoing first invention, the holes are removed from the semiconductor base material through one of the first impurity region or the second impurity region, and another of the first impurity layer or the second impurity layer is set to a floating state (sixth invention).

A memory apparatus using semiconductor devices of the present invention includes a block having arranged therein a plurality of pages each corresponding to the page of the memory apparatus according to any one of the foregoing first to sixth inventions, in which the first impurity region in the memory cell included in each of the plurality of pages connects to a source line, the second impurity region connects to a bit line, one of the first gate conductor layer and the second gate conductor layer connects to a word line, and another of the first gate conductor layer and the second gate conductor layer connects to a first drive control line, the source line is connected in common to the semiconductor base materials in the block, and the page erase operation is performed by removing the holes in all of the semiconductor base materials in the selected page in the block based on each of voltages applied to the source line, the bit line, the first drive control line, and the word line (seventh invention).

In the foregoing seventh invention, the page erase operation is performed by removing the holes in all of the semiconductor base materials in the plurality of selected pages in the block (eighth invention).

In the foregoing first invention, one or both of the first gate conductor layer and the second gate conductor layer is/are split into two or more split gate conductor layers as seen in plan view or in the vertical direction, and the split two or more gate conductor layers are operated synchronously or asynchronously (ninth invention).

In the foregoing ninth invention, the split gate conductor layers of one of the first gate conductor layer and the second gate conductor layer are arranged on opposite sides of another of the first gate conductor layer or the second gate conductor layer in the vertical direction (tenth invention).

BRIEF DESCRIPTION OF THE DRAWINGS

FIGS. 4BA, 4BB, 4BC and 4BD are views for illustrating the mechanism of a page erase operation for the memory apparatus including the SGTs according to the first embodiment;

FIGS. 4DA, 4DB, 4DC and 4DD are views for illustrating the mechanism of a page erase operation for the memory apparatus including the SGTs according to the first embodiment;

FIGS. 4EA, 4EB, 4EC and 4ED are views for illustrating the mechanism of a page erase operation for the memory apparatus including the SGTs according to the first embodiment;

FIGS. 5A, 5B and 5C are views for illustrating the mechanism of a read operation for the memory apparatus including the SGTs according to the first embodiment;

DETAILED DESCRIPTION OF THE PREFERRED EMBODIMENTS

Hereinafter, embodiments of a memory apparatus using semiconductor devices (hereinafter referred to as dynamic flash memory) according to the present invention will be described with reference to the drawings.

First Embodiment

The structure and operation mechanism of a dynamic flash memory cell according to a first embodiment of the present invention will be described with reference to FIGS. 1 to 5C. The structure of the dynamic flash memory cell will be described with reference to FIG. 1. Then, the effects obtained when the gate capacitance of a first gate conductor layer 5a connected to a plate line PL is set larger than the gate capacitance of a second gate conductor layer 5b connected to a word line WL will be described with reference to FIGS. 2A, 2B and 2C. Then, the mechanism of a data write operation will be described with reference to FIGS. 3AA, 3AB, 3AC and 3B, the mechanism of a data erase operation will be described with reference to FIGS. 4A to 4ED, and the mechanism of a data read operation will be described with reference to FIGS. 5A, 5B and 5C.

Figure 1:
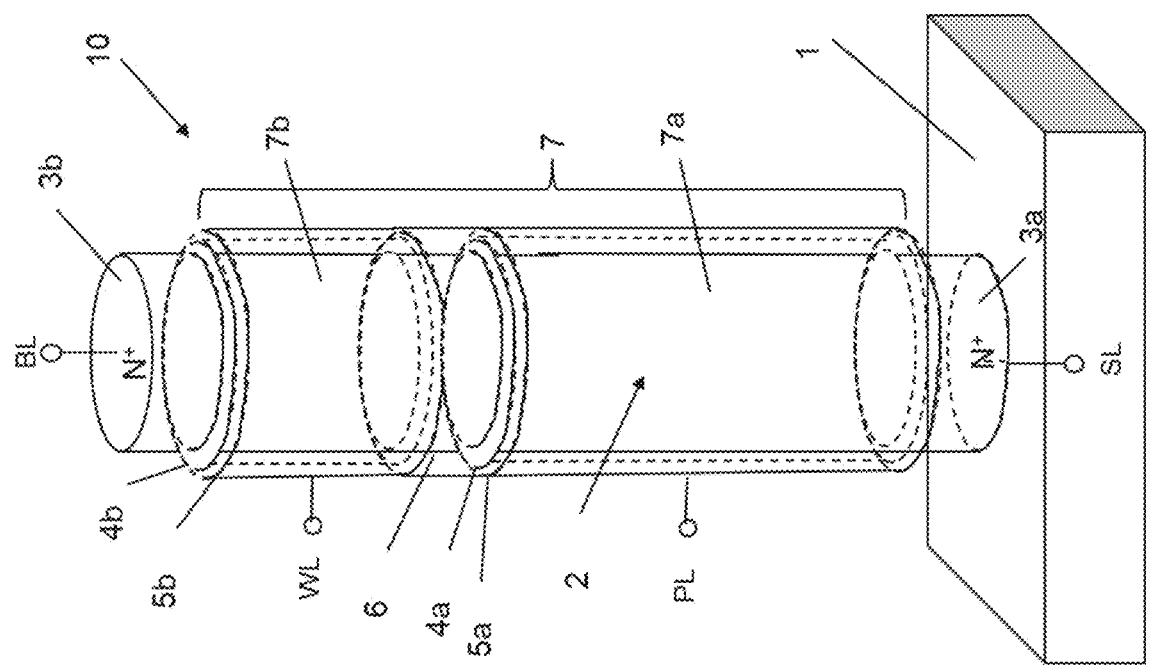
FIG. 1 is a view illustrating the structure of a memory apparatus including SGTs according to a first embodiment.

FIG. 1 illustrates the structure of the dynamic flash memory cell according to the first embodiment of the present invention. N+ layers 3a and 3b (which are examples of a "first impurity region" and a "second impurity region" in the claims), one of which serves as a source and the other of which serves as a drain, are formed at positions above and below a silicon semiconductor pillar 2 (hereinafter, the silicon semiconductor pillar shall be referred to as a "Si pillar") with p-type or i-type (intrinsic) conductivity (which is an example of a "semiconductor base material" in the claims) formed on a substrate 1 (which is an example of a "substrate" in the claims). The portion of the Si pillar 2 between the N+ layers 3a and 3b serving as the source and the drain is a semiconductor base material 7 (which is an example of a "semiconductor base material" in the claims). A first gate insulating layer 4a (which is an example of a "first gate insulating layer" in the claims) and a second gate insulating layer 4b (which is an example of a "second gate insulating layer" in the claims) are formed so as to surround the semiconductor bae material 7. The first gate insulating layer 4a and the second gate insulating layer 4b are respectively in contact with or located in proximity to the N+ layers 3a and 3b serving as the source and the drain. A first gate conductor layer 5a (which is an example of a "first gate conductor layer" in the claims) and a second gate conductor layer 5b (which is an example of a "second gate conductor layer" in the claims) are respectively formed so as to surround the first gate insulating layer 4a and the second gate insulating layer 4b. The first gate conductor layer 5a and the second gate conductor layer 5b are separated by an insulating layer 6 (which is an example of a "first insulating layer" in the claims). The semiconductor base material 7 between the N+ layers 3a and 3b includes a first channel Si layer 7a (which is an example of a "first semiconductor base material" in the claims) surrounded by the first gate insulating layer 4a, and a second channel Si layer 7b (which is an example of a "second semiconductor base material" in the claims) surrounded by the second gate insulating layer 4b. Accordingly, a dynamic flash memory cell 10 is formed that includes the N+ layers 3a and 3b serving as the source and the drain, the semiconductor base material 7, the first gate insulating layer 4a, the second gate insulating layer 4b, the first gate conductor layer 5a, and the second gate conductor layer 5b. The N+ layer 3a serving as the source connects to a source line SL (which is an example of a "source line" in the claims), the N+ layer 3b serving as the drain connects to a bit line BL (which is an example of a "bit line" in the claims), the first gate conductor layer 5a connects to a plate line PL (which is an example of a "first drive control line" in the claims), and the second gate conductor layer 5b connects to a word line WL (which is an example of a "word line" in the claims). The dynamic flash memory cell 10 desirably has such a structure that the gate capacitance of the first gate conductor layer 5a connecting to the plate line PL is larger than the gate capacitance of the second gate conductor layer 5b connecting to the word line WL.

It should be noted that in FIG. 1, the gate length of the first gate conductor layer 5a is set longer than the gate length of the second gate conductor layer 5b such that the gate capacitance of the first gate conductor layer 5a connected to the plate line PL becomes larger than the gate capacitance of the second gate conductor layer 5b connected to the word line WL. However, it is also possible to, without setting the gate length of the first gate conductor layer 5a to be longer than the gate length of the second gate conductor layer 5b, vary the thicknesses of the two gate insulating layers such that the thickness of the gate insulating film for the first gate insulating layer 4a becomes thinner than the thickness of the gate insulating film for the second gate insulating layer 4b. Alternatively, it is also possible to vary the dielectric constants of the materials of the two gate insulating layers such that the dielectric constant of the gate insulating film for the first gate insulating layer 4a becomes higher than the dielectric constant of the gate insulating film for the second gate insulating layer 4b. As a further alternative, it is also possible to combine any of the lengths of the gate conductor layers 5a and 5b and the thicknesses and dielectric constants of the gate insulating layers 4a and 4b so that the gate capacitance of the first gate conductor layer 5a connected to the plate line PL becomes larger than the gate capacitance of the second gate conductor layer 5b connected to the word line WL.

Figure 2A:
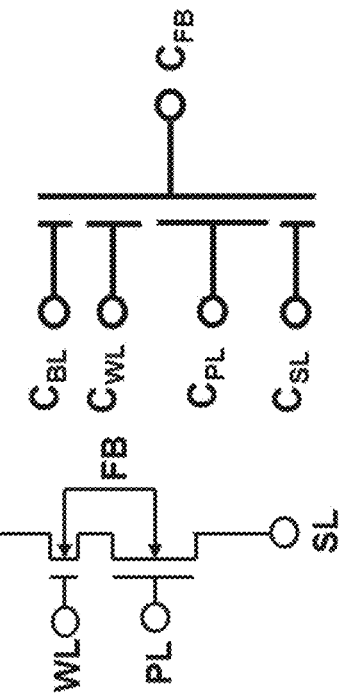
FIGS. 2A, 2B and 2C are views illustrating the effects obtained when the gate capacitance of a first gate conductor layer 5a connected to a plate line PL is set larger than the gate capacitance of a second gate conductor layer 5b connected to a word line WL in the memory apparatus including the SGTs according to the first embodiment.
Figure 2B:
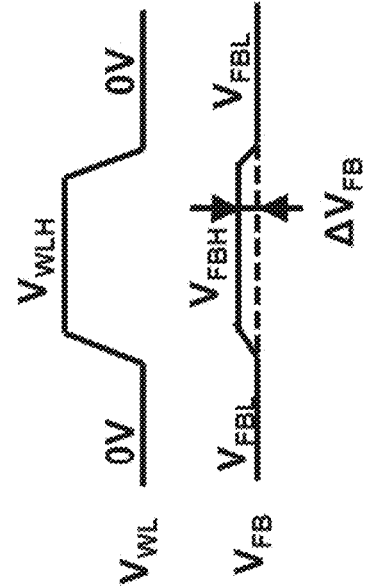
Figure 2C:
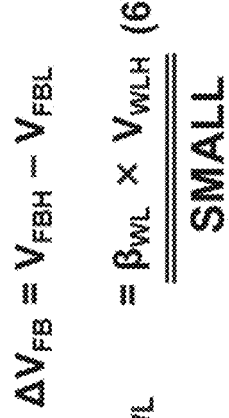
Figure 2C:
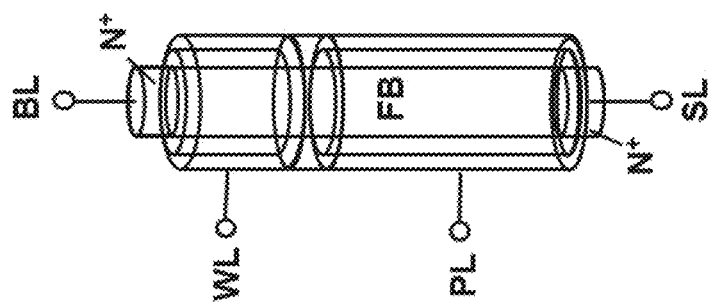

FIGS. 2A, 2B and 2C are views illustrating the effects obtained when the gate capacitance of the first gate conductor layer 5a connected to the plate line PL is set larger than the gate capacitance of the second gate conductor layer 5b connected to the word line WL.

FIG. 2A schematically illustrates only the main portion of the structure of the dynamic flash memory cell according to the first embodiment of the present invention. The bit line BL, the word line WL, the plate line PL, and the source line SL are connected to the dynamic flash memory cell, and the potential state of the semiconductor base material 7 is determined by their voltage states.

FIG. 2B is a view for illustrating the relationship between their capacitances. The capacitance $C_{FB}$ of the semiconductor base material 7 is equal to the sum of the capacitance $C_{WL}$ between the gate conductor layer 5b connecting to the word line WL and the semiconductor base material 7, the capacitance $C_{PL}$ between the gate conductor layer 5a connecting to the plate line PL and the semiconductor base material 7, the junction capacitance $C_{3L}$ of a P-N junction between the source N+ layer 3a connecting to the source line SL and the semiconductor base material 7, and the junction capacitance $C_{BL}$ of a P-N junction between the drain N+ layer 3b connecting to the bit line BL and the semiconductor base material 7, and is represented as follows.

$$C_{FB}=C_{WL}+C_{PL}+C_{BL}+C_{SL} \quad (1).$$

Thus, the coupling ratio $\beta_{WL}$ between the word line WL and the semiconductor base material 7, the coupling ratio $\beta_{PL}$ between the plate line PL and the semiconductor base material 7, the coupling ratio $\beta_{BL}$ between the bit line BL and the semiconductor base material 7, and the coupling ratio $\beta_{SL}$ the between the source line SL and the semiconductor base material 7 are represented as follows.

$$\beta_{WL}=C_{WL}/(C_{WL}+C_{PL}+C_{BL}+C_{SL}) \quad (2)$$

$$\beta_{PL}=C_{PL}/(C_{WL}+C_{PL}+C_{BL}+C_{SL}) \quad (3)$$

$$\beta_{BL}=C_{BL}/(C_{WL}+C_{PL}+C_{BL}+C_{SL}) \quad (4)$$

$$\beta_{SL}=C_{SL}/(C_{WL}+C_{PL}+C_{BL}+C_{SL}) \quad (5)$$

Herein, since $C_{PL}>C_{WL}$, $\beta_{PL}>\beta_{WL}$.

FIG. 2C is a view for illustrating changes in the voltage $V_{FB}$ of the semiconductor base material 7 when the voltage $V_{WL}$ of the word line WL rises and then drops during a read operation or a write operation. Herein, the potential difference $\Delta V_{FB}$ when the voltage $V_{FB}$ of the semiconductor base material 7 changes from a low voltage state $V_{FBL}$ to a high voltage state $V_{FBH}$ as the voltage $V_{WL}$ of the word line WL rises from 0 V to a high voltage state $V_{WL}H$ is as follows.

$$\Delta V_{FB}=V_{FBH}-V_{FBL}=\beta_{WL}\times V_{WL} \quad (6)$$

Since the coupling ratio $\beta_{WL}$ between the word line WL and the semiconductor base material 7 is small and the coupling ratio $\beta_{PL}$ between the plate line PL and the semiconductor base material 7 is large, $\Delta V_{FB}$ is small. Thus, even when the voltage $V_{WL}$ of the word line WL oscillates up and down during a read operation or a write operation, the voltage $V_{FB}$ of the semiconductor base material 7 hardly changes.

Figure 3A:
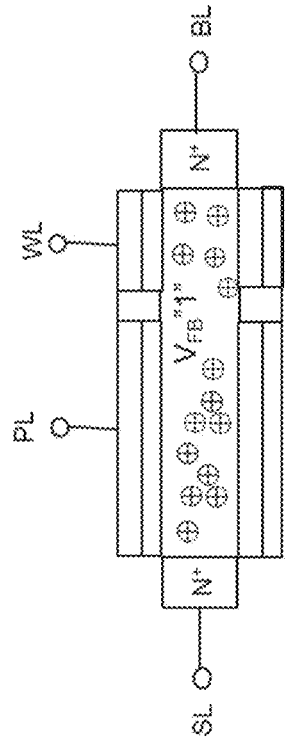
FIGS. 3AA, 3AB and 3AC are views for illustrating the mechanism of a write operation for the memory apparatus including the SGTs according to the first embodiment.
Figure 3A:
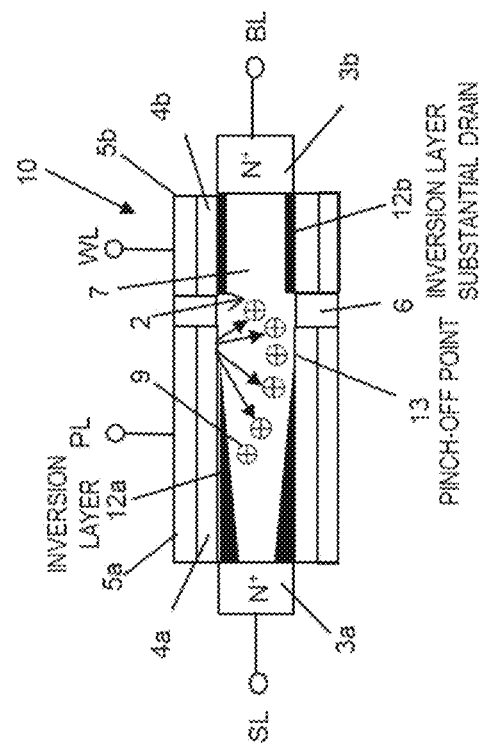

FIGS. 3AA, 3AB and 3AC and 3B illustrates a page write operation (which is an example of a "page write operation" in the claims) for the dynamic flash memory cell according to the first embodiment of the present invention. FIG. 3AA illustrates the mechanism of the write operation, and FIG. 3AB illustrates the operation waveforms of the bit line BL, the source line SL, the plate line PL, the word line WL, and the semiconductor base material 7 functioning as a floating body FB. At a time T0, the dynamic flash memory cell is in a "0" erase state and the voltage of the semiconductor base material 7 is $V_{FB}$"0." In addition, Vss is applied to each of the bit line BL, the source line SL, and the word line WL, and $V_{PLL}$ is applied to the plate line PL. Herein Vss is 0 V and $V_{PLL}$ is 2 V, for example. Next, at times T1 to T2, when the voltage of the bit line BL rises from Vss to $V_{BLH}$, if Vss is 0 V, for example, the voltage of the semiconductor base material 7 becomes $V_{FB}$"0"+$\beta_{BL}\times V_{BLH}$ due to the capacitive coupling between the bit line BL and the semiconductor base material 7.

Next, the description of the write operation for the dynamic flash memory cell will be continued with reference to FIGS. 3AA and 3AB. At times T3 to T4, the voltage of the word line WL rises from Vss to $V_{WLH}$. Accordingly, provided that the "0" erase threshold voltage of a second N-channel MOS transistor region in the semiconductor base material 7 surrounded by the second gate conductor layer 5b connecting to the word line WL is $Vt_{WL}$"0," the voltage of the semiconductor base material 7 becomes $V_{FB}$"0"+$\beta_{BL}\times V_{BLH}$+$\beta_{WL}\times Vt_{WL}$"0" in the range of Vss to $Vt_{WL}$"0" due to a second capacitive coupling (which is an example of a "second capacitive coupling" in the claims) between the word line WL and the semiconductor base material 7 as the voltage of the word line WL rises. When the voltage of the word line WL has risen to $Vt_{WL}$"0" or greater, an annular inversion layer 12b is formed in the semiconductor base material 7 on the inner periphery of the second gate conductor layer 5b, which blocks the second capacitive coupling between the word line WL and the semiconductor base material 7.

Next, the description of the write operation for the dynamic flash memory cell will be continued with reference to FIGS. 3AA and 3AB. At the times T3 to T4, $V_{PLL}$=2 V, for example, is fixedly input to the first gate conductor layer 5a connecting to the plate line PL, and the voltage of the second gate conductor layer 5b connecting to the word line WL is increased to $V_{WLH}$=4 V, for example. Consequently, as illustrated in FIG. 3AA, an annular inversion layer 12a is formed in the semiconductor base material 7 on the inner periphery of the first gate conductor layer 5a connecting to the plate line PL, and the inversion layer 12a has a pinch-off point 13. Thus, a first N-channel MOS transistor region having the first gate conductor layer 5a operates in the saturation region. Meanwhile, the second N-channel MOS transistor region having the second gate conductor layer 5b connecting to the word line WL operates in the linear region. Thus, there is no pinch-off point in the semiconductor base material 7 on the inner periphery of the second gate conductor layer 5b connecting to the word line WL, and the inversion layer 12b is formed on the entire surface of the inner periphery of the gate conductor layer 5b. The inversion layer 12b formed on the entire surface of the inner periphery of the second gate conductor layer 5b connecting to the word line WL functions as a substantial drain of the second N-channel MOS transistor region having the second gate conductor layer 5b. Thus, an electric field in a first boundary region of the semiconductor base material 7 between the first N-channel MOS transistor region having the first gate conductor layer 5a and the second N-channel MOS transistor region having the second gate conductor layer 5b, which are connected in series, becomes maximum, and an impact ionization phenomenon occurs in the region. Such a region is a region on the source side as seen from the second N-channel MOS transistor region having the second gate conductor layer 5b connecting to the word line WL. Thus, such a phenomenon is called a source-side impact ionization phenomenon. Due to the source-side impact ionization phenomenon, electrons flow from the $N^+$ layer 3a connecting to the source line SL to the $N^+$ layer 3b connecting to the bit line. The accelerated electrons collide with Si lattice atoms, and electron-hole pairs are generated due to the kinetic energy. Some of the generated electrons flow into the first gate conductor layer 5a and the second gate conductor layer 5b, but most of them flow into the $N^+$ layer 3b connecting to the bit line BL (not illustrated).

As illustrated in FIG. 3AC, the generated holes 9 (which are examples of "holes" in the claims) are the majority carriers in the semiconductor base material 7, and charge the semiconductor base material 7 in a positively biased manner. Since the $N^+$ layer 3a connecting to the source line SL is at 0 V, the semiconductor base material 7 is charged up to the built-in voltage Vb (about 0.7 V) of the P-N junction between the $N^+$ layer 3a connecting to the source line SL and the semiconductor base material 7. When the semiconductor base material 7 is charged in a positively biased manner, the threshold voltage of each of the first N-channel MOS transistor region and the second N-channel MOS transistor region becomes lower due to the substrate bias effect.

Next, the description of the write operation for the dynamic flash memory cell will be continued with reference to FIG. 3AB. At times T6 to T7, the voltage of the word line WL drops from $V_{WLH}$ to Vss. At this time, the second capacitive coupling occurs between the word line WL and the semiconductor base material 7, but until the voltage $V_{WLH}$ of the word line WL becomes less than or equal to the threshold voltage $Vt_{WL}$"1" of the second N-channel MOS transistor region when the voltage of the semiconductor base material 7 is Vb, the inversion layer 12b blocks the second capacitive coupling. Thus, the substantial capacitive coupling between the word line WL and the semiconductor base material 7 occurs only when the voltage of the word line WL has become less than or equal to $Vt_{WL}$"1" and has dropped down to Vss. Consequently, the voltage of the semiconductor base material 7 becomes Vb−$β_{WL}$×$Vt_{WL}$"1." Herein, $Vt_{WL}$"1" is lower than $Vt_{WL}$"0," and $β_{WL}$×$Vt_{WL}$"1" is small.

Next, the description of the write operation for the dynamic flash memory cell will be continued with reference to FIG. 3AB. At times T8 to T9, the voltage of the bit line BL drops from $V_{BLH}$ to Vss. Since the bit line BL and the semiconductor base material 7 are capacitively coupled, the voltage $V_B$"1" of the semiconductor base material 7 with "1" written thereto finally becomes as follows.

$$V_{FB}\text{"1"}=Vb-\beta_{WL}\times Vt_{WL}\text{"1"}-\beta_{BL}\times V_{BLH} \tag{7}$$

Figure 3B:
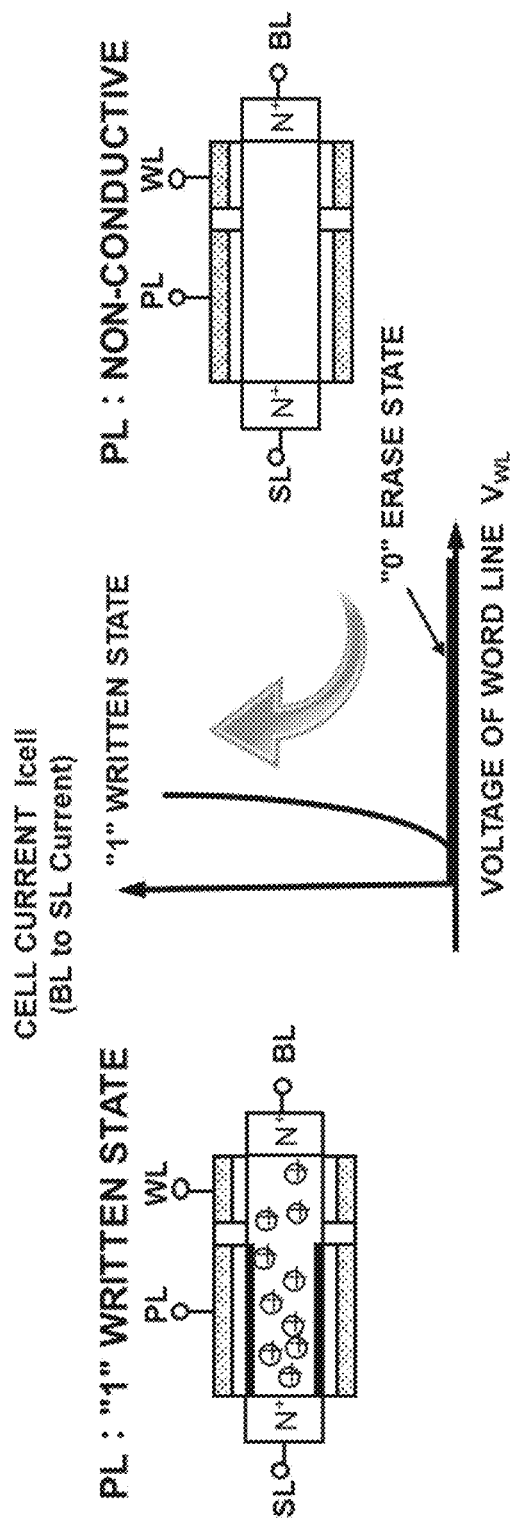
FIG. 3B is a view for illustrating the mechanism of a write operation for the memory apparatus including the SGTs according to the first embodiment.

Herein, the coupling ratio $β_{BL}$ between the bit line BL and the semiconductor base material 7 is also small. Accordingly, as illustrated in FIG. 3B, the threshold voltage of the second N-channel MOS transistor region in the second semiconductor base material 7b connecting to the word line WL becomes low. The memory write operation (which is an example of a "memory write operation" in the claims) is performed by setting the voltage of the semiconductor base material 7 in the "1" written state as a first data retention voltage (which is an example of a "first data retention voltage" in the claims), and such a state is allocated as logical memory data "1."

It should be noted that during the write operation, it is also possible to generate electron-hole pairs through an impact ionization phenomenon not in the first boundary region but in a second boundary region between the first impurity region 3a and the first semiconductor base material 7a or a third boundary region between the second impurity region 3b and the second semiconductor base material 7b, and then charge the semiconductor base material 7 with the generated holes 9.

The mechanism of a page erase operation (which is an example of a "page erase operation" in the claims) will be described with reference to FIGS. 4A to 4ED.

Figure 4A:
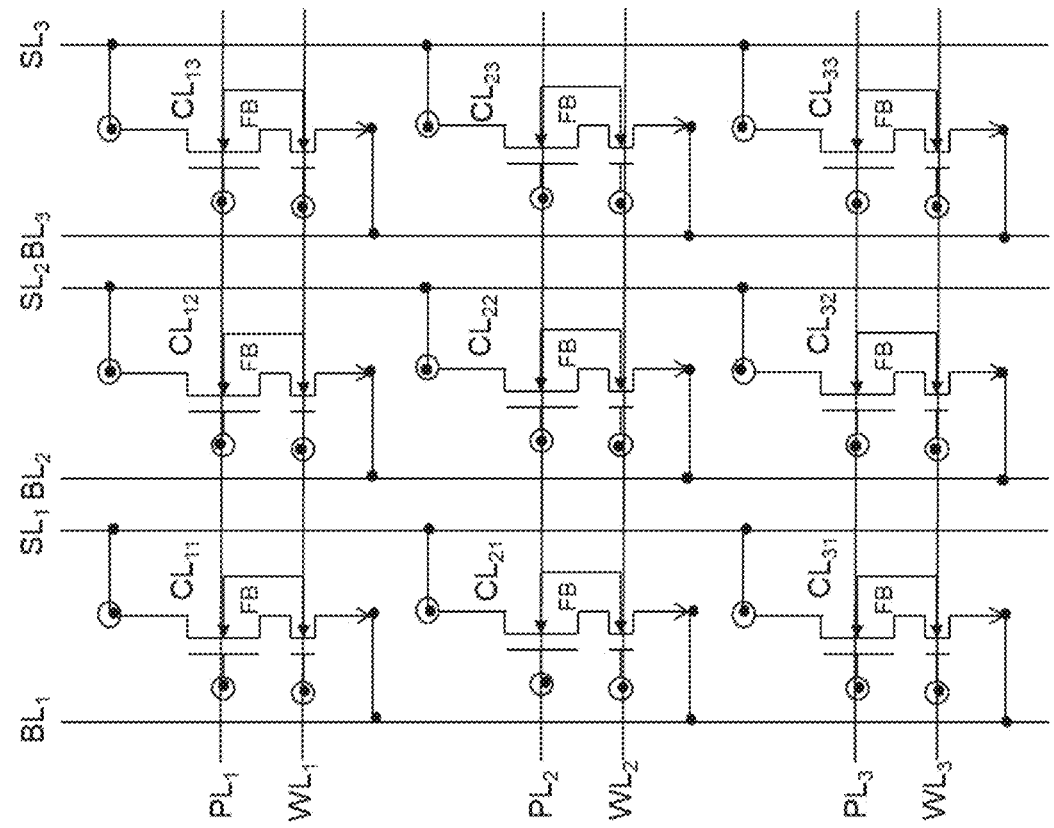
FIG. 4A is a diagram for illustrating the mechanism of a page erase operation for the memory apparatus including the SGTs according to the first embodiment.

FIG. 4A illustrates a memory block circuit diagram for illustrating a page erase operation. Herein a total of nine (3 rows×3 columns) memory cells $CL_{11}$ to $CL_{33}$ are illustrated, but the actual memory block is larger than such a matrix. When memory cells are arranged in a matrix, one of the directions of the array is referred to as a "row direction" (or "rows"), and a direction perpendicular thereto is referred to as a "column direction" (or "columns"). A source line SL, bit lines $BL_1$ to $BL_3$, plate lines $PL_1$ to $PL_3$, and word lines $WL_1$ to $WL_3$ are connected to the respective memory cells. For example, a case is considered where a page erase operation is performed by selecting memory cells $CL_{21}$ to $CL_{23}$ connecting to the plate line $PL_2$ and the word line $WL_2$ in the block.

The mechanism of the page erase operation will be described with reference to FIGS. 4BA, 4BB, 4BC, 4BD and 4C. Herein, the semiconductor base material 7 between the N⁺ layers 3a and 3b is electrically isolated from the substrate, and functions as a floating body. FIG. 4BA is an operation timing waveform chart of the primary nodes in the erase operation. In FIG. 4BA, T0 to T12 represent a period of times from when the erase operation starts till it ends. FIG. 4BB illustrates a state in which the holes 9 generated through impact ionization in a previous cycle are stored in the semiconductor base material 7 at the time T0 before the erase operation is started. At the times T1 to T2, the bit lines $BL_1$ to $BL_3$ and the source line SL respectively become high voltage states of $V_{BLH}$ and $V_{SLH}$ from Vss. Herein, Vss is 0 V, for example. In the next period times T3 to T4 (which are examples of a "first period" in the claims), the plate line $PL_2$ and the word line $WL_2$ selected in the page erase operation respectively become a high voltage state of a second voltage $V_{PLH}$ (which is an example of a "second voltage" in the claims) from a first voltage $V_{PLL}$ (which is an example of a "first voltage" in the claims) and a high voltage state of a fourth voltage $V_{WLH}$ (which is an example of a "fourth voltage" in the claims) from a third voltage Vss (which is an example of a "third voltage" in the claims). Thus, neither the inversion layer 12a (which is an example of a "inversion layer" in the claims) on the inner periphery of the first gate conductor layer 5a connecting to the plate line $PL_2$ nor the inversion layer 12b on the inner periphery of the second gate conductor layer 5b connecting to the word line $WL_2$ is formed in the semiconductor base material 7. Thus, provided that the threshold voltage of the second N-channel MOS transistor region on the side of the word line $WL_2$ is $V_{tWL}$ and the threshold voltage of the of the first N-channel MOS transistor region on the side of the plate line $PL_2$ is $V_{tPL}$, it is desirable that the voltages $V_{BLH}$ and $V_{SLH}$ satisfy $V_{BLH}>V_{WLH}+V_{tWL}$ and $V_{SLH}>V_{PLH}+V_{tPL}$. For example, when $V_{tWL}$ and $V_{tPL}$ are 0.5 V, $V_{WLH}$ and $V_{PLH}$ may be set to 3 V, and $V_{BLH}$ and $V_{SLH}$ may be set to greater than or equal to 3.5 V.

Next, the description of the mechanism of the page erase operation in FIG. 4BA will be continued. At the times T3 to T4 of a first period, as the plate line $PL_2$ and the word line $WL_2$ respectively become high voltage states of the second voltage $V_{PL}H$ and the fourth voltage $V_{WLH}$, the voltage of the semiconductor base material 7 in the floating state is boosted due to the first capacitive coupling (which is an example of a "first capacitive coupling" in the claims) between the plate line $PL_2$ and the semiconductor base material 7 and the second capacitive coupling between the word line $WL_2$ and the semiconductor base material 7. The voltage of the semiconductor base material 7 becomes a high voltage from $V_{FB}$"1" in the "1" written state. This is because since the bit lines $BL_1$ to $BL_3$ and the source line SL are respectively at high voltages of $V_{BLH}$ and $V_{SLH}$, the P-N junction between the source N⁺ layer 3a and the semiconductor base material 7 and the P-N junction between the drain N⁺ layer 3b and the semiconductor base material 7 are reverse-biased, which allows for boosting of the voltage of the semiconductor base material 7.

Next, the description of the mechanism of the page erase operation in FIG. 4BA will be continued. At the times T5 to T6 of the next period (which is an example of a "second period" in the claims), the voltages of the bit lines $BL_1$ to $BL_3$ and the source line SL respectively drop from the high voltages of $V_{BLH}$ and $V_{SLH}$ to Vss. Consequently, the P-N junction between the source N⁺ layer 3a and the semiconductor base material 7 and the P-N junction between the drain N⁺ layer 3b and the semiconductor base material 7 are forward-biased as illustrated in FIG. 4BC, and the remaining holes (which are examples of "remaining holes" in the claims) of the holes 9 in the semiconductor base material 7 are discharged to the source N⁺ layer 3a and the drain N⁺ layer 3b. Thus, the voltage $V_{FB}$ of the semiconductor base material 7 becomes the built-in voltage Vb of the P-N junction formed by the source N⁺ layer 3a and the semiconductor base material 7 as the P-layer and the P-N junction formed by the drain N⁺ layer 3b and the semiconductor base material 7 as the P-layer.

Next, the description of the mechanism of the page erase operation in FIG. 4BA will be continued. Next, at the times T7 to T8, the voltages of the bit lines $BL_1$ to $BL_3$ and the source line SL respectively rise from Vss to high voltages of $V_{BLH}$ and $V_{SLH}$. Accordingly, as illustrated in FIG. 4BD, when the voltages of the plate line $PL_2$ and the word line $WL_2$ respectively drop from the second voltage $V_{PLH}$ and the fourth voltage $V_{WLH}$ to the first voltage $V_{PLL}$ and the third voltage Vss at the times T11 to T12 (which are examples of a "third period" in the claims), neither the inversion layer 12a on the side of the plate line $PL_2$ nor the inversion layer 12b on the side of the word line $WL_2$ is formed in the semiconductor base material 7. Thus, the voltage $V_{FB}$ of the semiconductor base material 7 efficiently becomes $V_{FB}$"0" from Vb due to the first capacitive coupling between the plate line $PL_2$ and the semiconductor base material 7 and the second capacitive coupling between the word line $WL_2$ and the semiconductor base material 7. Thus, the voltage difference $\Delta V_{FB}$ of the semiconductor base material 7 between the "1" written state and the "0" erase state is represented by the following expression.

$$V_{FB}\text{"1"}=Vb-\beta_{WL}\times Vt_{WL}\text{"1"}-\beta_{BL}\times V_{BLH} \quad (7)$$

$$V_{FB}\text{"0"}=Vb-\beta_{WL}\times V_{WLH}-\beta_{PL}\times(V_{PLH}-V_{PLL}) \quad (8)$$

$$\Delta V_{FB}=V_{FB}\text{"1"}-V_{FB}\text{"0"}=\beta_{WL}\times V_{WLH}+\beta_{PL}\times(V_{PLH}-V_{PLL})-\beta_{WL}\times Vt_{WL}\text{"1"}-\beta_{BL}\times V_{BLH} \quad (9)$$

Herein, since the sum of $\beta_{WL}$ and $\beta_{PL}$ is greater than or equal to 0.8, $\Delta V_{FB}$ is large enough to provide a margin.

Figure 4C:
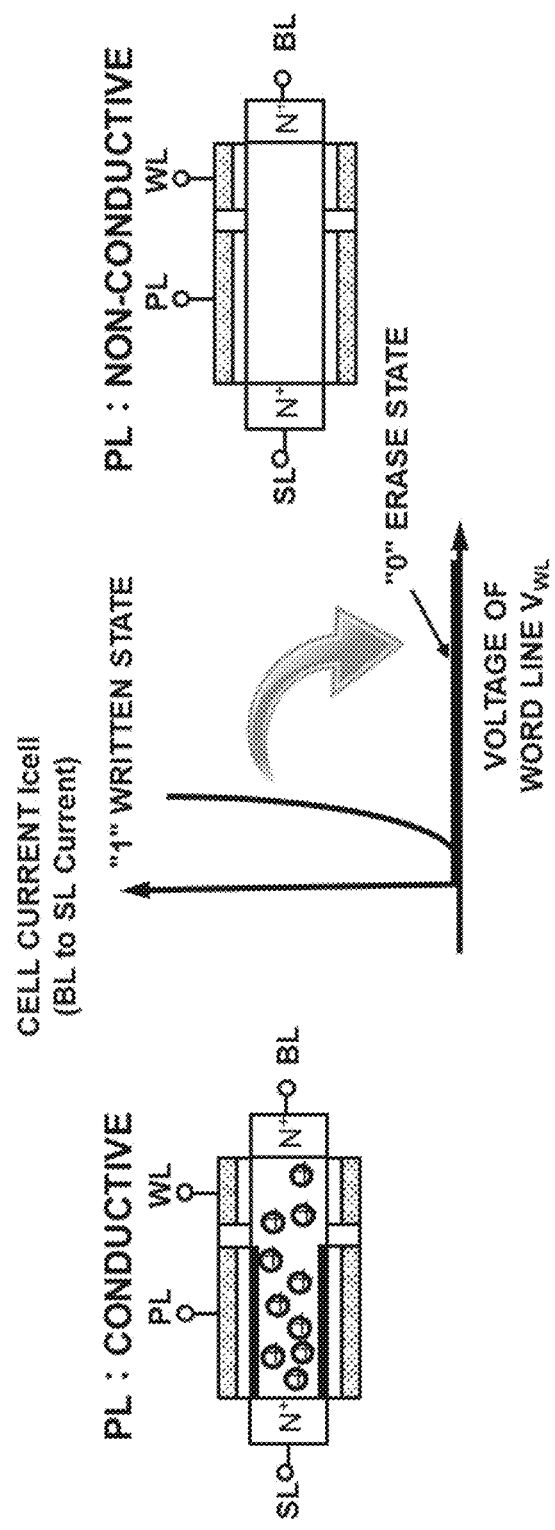
FIG. 4C is a view for illustrating the mechanism of a page erase operation for the memory apparatus including the SGTs according to the first embodiment.

Consequently, as illustrated in FIG. 4C, a large margin is provided between the "1" written state and the "0" erase state. Herein, in the "0" erase state, the threshold voltage on the side of the plate line $PL_2$ is high due to the substrate bias effect. Thus, if the voltage applied to the plate line $PL_2$ is set to less than or equal to the threshold voltage, for example, the first N-channel MOS transistor region on the side of the plate line $PL_2$ becomes non-conductive, and thus, no memory cell current flows therethrough. Such a state is illustrated.

Next, the description of the mechanism of the page erase operation in FIG. 4BA will be continued. Next, at the times T11 to T12 of a third period, the voltages of the bit lines $BL_1$ to $BL_3$ and the source line SL respectively drop from $V_{BLH}$ to Vss and from $V_{SLH}$ to Vss, whereby the erase operation terminates. At this time, the voltage of the semiconductor base material 7 is slightly lowered by the bit lines $BL_1$ to $BL_3$ and the source line SL due to capacitive coupling. However, since the amount of the lowered voltage is equal to the amount of the voltage of the semiconductor base material 7 increased by the bit lines $BL_1$ to $BL_3$ and the source line SL due to capacitive coupling at the times T7 to T8, the voltage rise and drop of each of the bit lines $BL_1$ to $BL_3$ and the source line SL are cancelled out, and thus have no influence on the voltage of the semiconductor base material 7. The page erase operation is performed by setting the voltage $V_{FB}$"0" of the semiconductor base material 7 in the "0" erase state as a second data retention voltage (which is an example of a "second data retention voltage" in the claims), and such a state is allocated as logical memory data "0."

Next, the mechanism of a page erase operation will be described with reference to FIGS. 4DA, 4DB, 4DC and 4DD. FIGS. 4DA, 4DB, 4DC and 4DD differ from FIGS. 4BA, 4BB, 4BC and 4BD in that during the page erase operation, the bit lines $BL_1$ to $BL_3$ are set to Vss or to a floating state, and the voltage of the word line $WL_2$ is fixed to Vss. Accordingly, even when the voltage of the source line SL rises from Vss to $V_{SLH}$ at times T1 to T2, the second N-channel MOS transistor region on the side of the word line $WL_2$ does not become conductive, and thus, no memory cell current flows therethrough. Thus, there is no hole 9 generated through an impact ionization phenomenon. Other than that, as in FIGS. 4BA, 4BB, 4BC and 4BD, the voltage of the source line SL oscillates between Vss and $V_{SLH}$, and the voltage of the plate line $PL_2$ oscillates between $V_{PLL}$ and $V_{PLH}$. Consequently, as illustrated in FIG. 4DC, the holes 9 are discharged to the N$^+$ layer 3a as the first impurity region connecting to the source line SL.

Next, the mechanism of a page erase operation will be described with reference to FIGS. 4EA, 4EB, 4EC and 4ED. FIGS. 4EA, 4EB, 4EC and 4ED differ from FIGS. 4BA, 4BB, 4BC and 4BD in that during the page erase operation, the source line SL is set to Vss or to a floating state, and the voltage of the plate line $PL_2$ is fixed to Vss. Accordingly, even when the voltages of the bit lines $BL_1$ to $BL_3$ rise from Vss to $V_{BLH}$ at times T1 to T2, the first N-channel MOS transistor region on the side of the plate line $PL_2$ does not become conductive, and thus, no memory cell current flows therethrough. Thus, there is no hole 9 generated through an impact ionization phenomenon. Other than that, as in FIGS. 4BA, 4BB, 4BC and 4BD, the voltages of the bit lines $BL_1$ to $BL_3$ oscillate between Vss and $V_{BLH}$, and the voltage of the word line $WL_2$ oscillates between Vss and $V_{WLH}$. Consequently, as illustrated in FIG. 4EC, the holes 9 are discharged to the N$^+$ layer 3b as the second impurity region connecting to one of the bit lines $BL_1$ to $BL_3$.

Figure 5C:
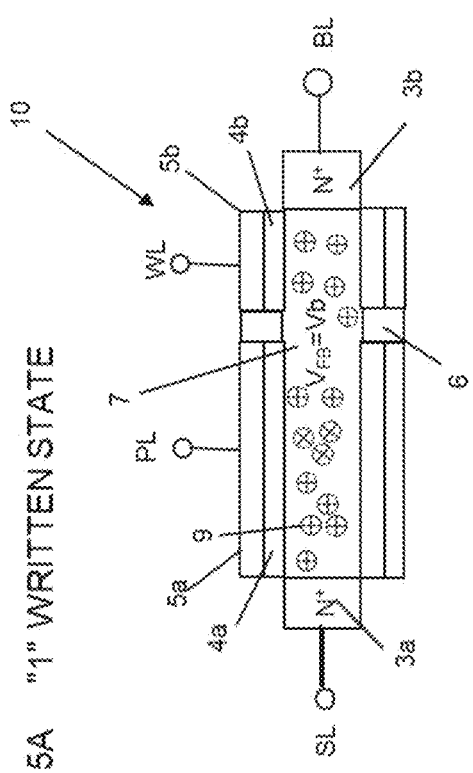
Figure 5C:
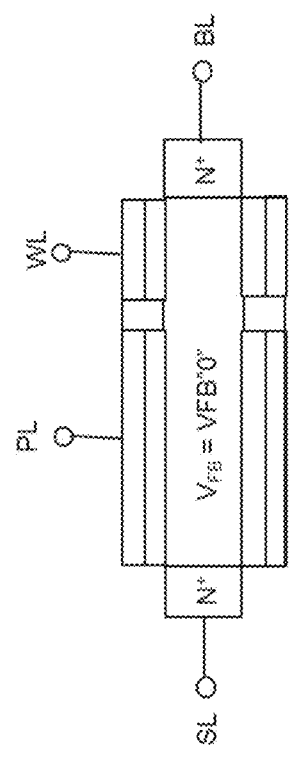
Figure 6B:
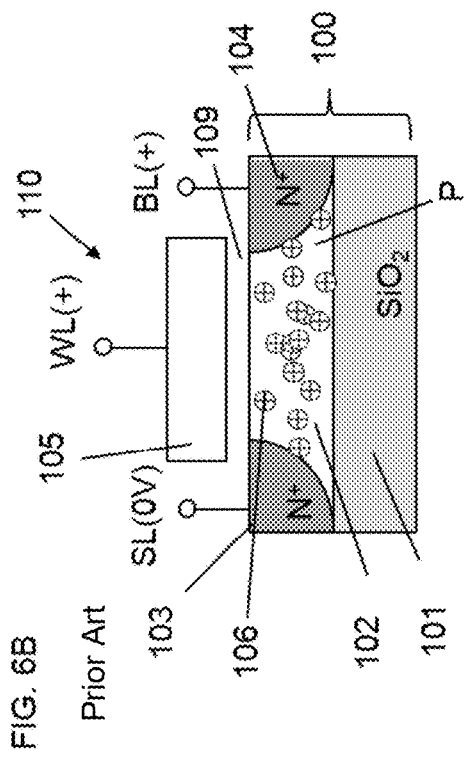
FIGS. 6A, 6B, 6C and 6D are views for illustrating a write operation for a conventional capacitorless DRAM memory cell.
Figure 6A:
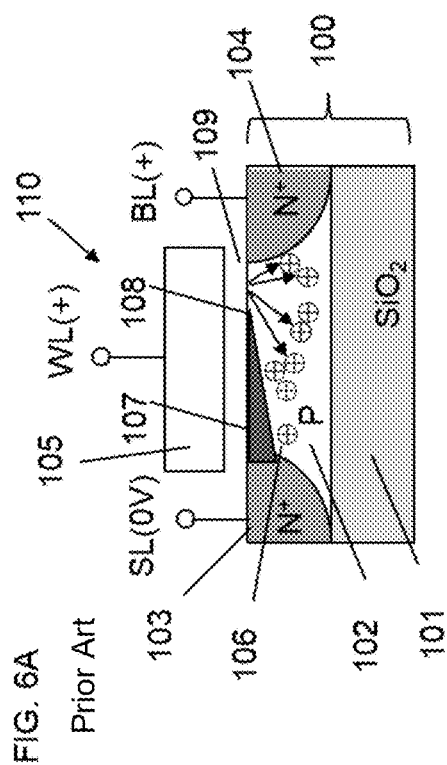
Figure 6C:
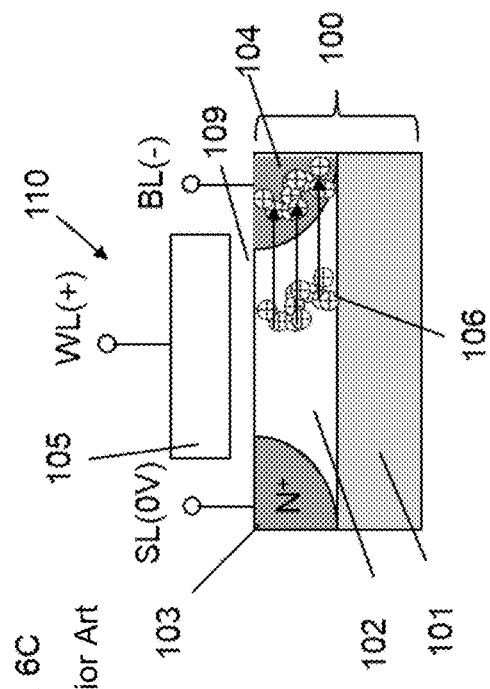
Figure 6D:
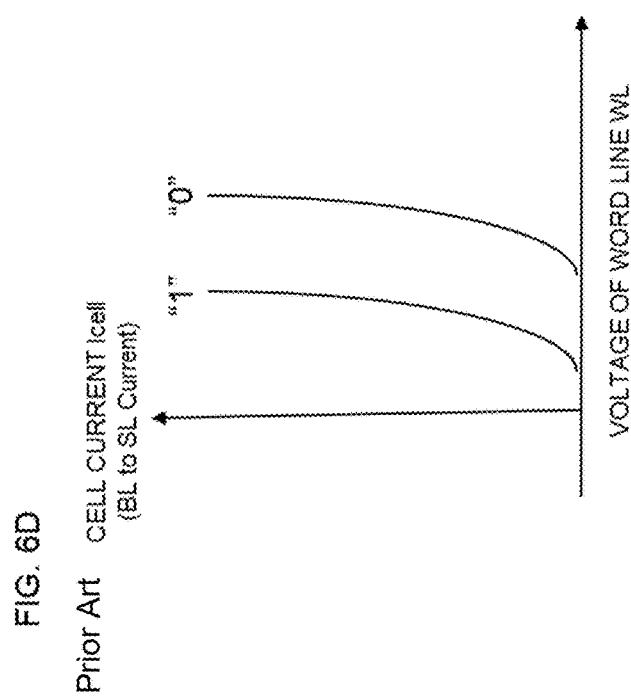
Figure 7A:
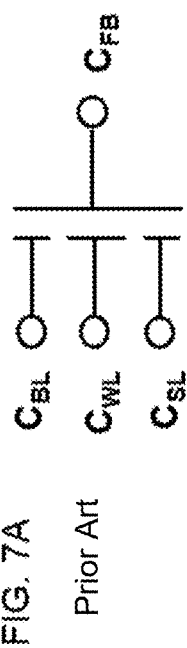
FIGS. 7A and 7B are views for illustrating problems with the operation of the conventional capacitorless DRAM memory cell.
Figure 7B:
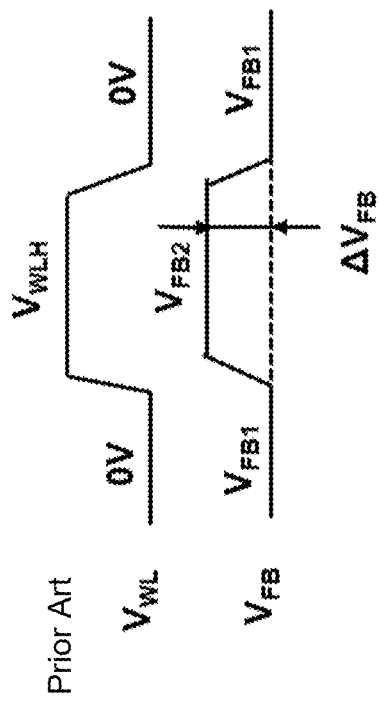
Figure 8C:
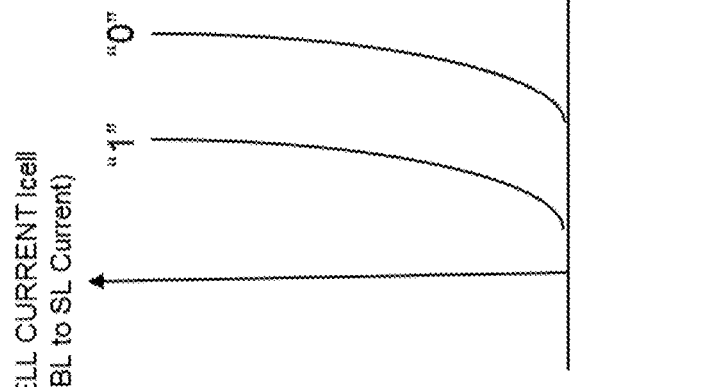
FIGS. 8A, 8B and 8C are views for illustrating a read operation for the conventional capacitorless DRAM memory cell.
Figure 8A:
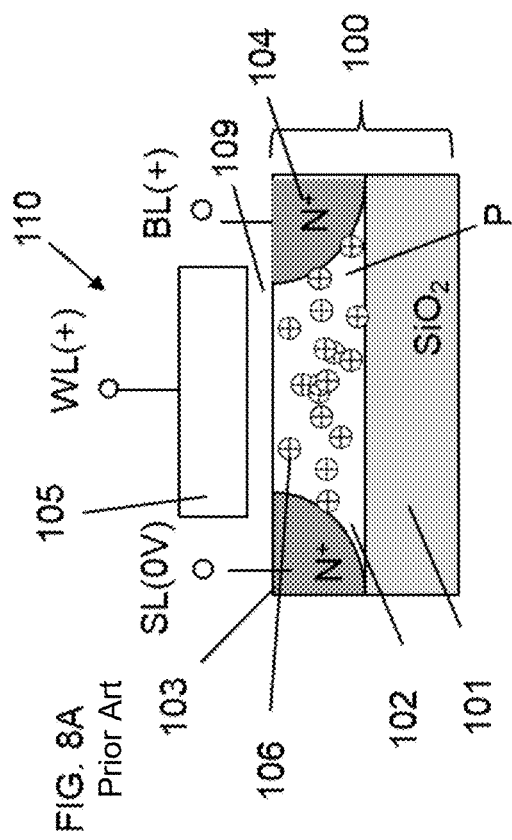
Figure 8B:
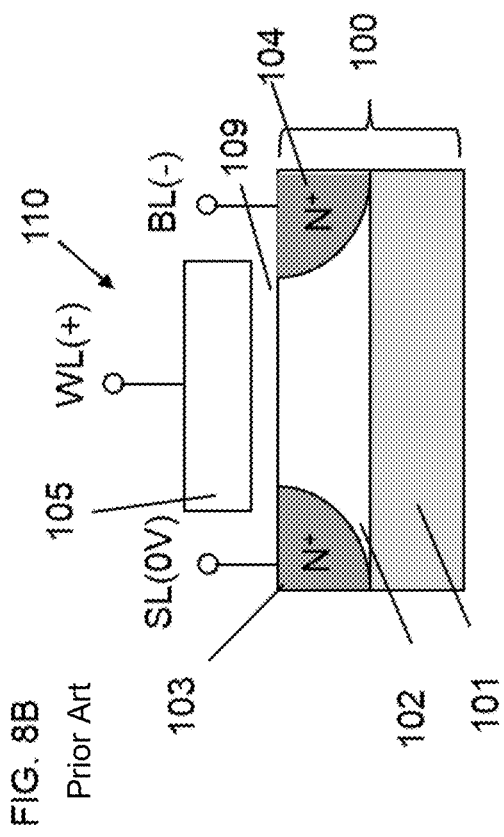

FIGS. 5A, 5B and 5C are views for illustrating a read operation for the dynamic flash memory cell according to the first embodiment of the present invention. As illustrated in FIG. 5A, when the semiconductor base material 7 is charged up to the built-in voltage Vb (about 0.7 V), the threshold voltage of the second N-channel MOS transistor region having the second gate conductor layer 5b connecting to the word line WL drops due to the substrate bias effect. Such a state is allocated as the logical memory data "1." As illustrated in FIG. 5B, a memory block selected before a write operation is performed is set to the erase state "0" in advance, and thus, the voltage $V_{FB}$ of the semiconductor base material 7 is $V_{FB}$"0." Through a write operation, the written state "1" is randomly stored. Consequently, logical memory data at logic levels "0" and "1" are created for the word line WL. As illustrated in FIG. 5C, reading is performed with a sense amplifier by utilizing the difference in level between the two threshold voltages for the word line WL.

The dynamic flash memory operation described in the present embodiment can be performed regardless of whether the horizontal cross-sectional shape of the Si pillar 2 in FIG. 1 is circular, elliptical, or rectangular. In addition, dynamic flash memory cells having Si pillars 2 with circular, elliptical, and rectangular horizontal cross-sections may be provided in a mixed manner on an identical chip.

A dynamic flash memory device has been described with reference to FIG. 1 regarding an example of a SGT in which the first gate insulating layer 4a and the second gate insulating layer 4b are provided around the entire side face of the Si pillar 2 disposed in an upright position on a substrate 1 along the vertical direction, and the first gate conductor layer 5a and the second gate conductor layer 5b are respectively provided around the entire first gate insulating layer 4a and the entire second gate insulating layer 4b. As described in the present embodiment, it is acceptable as long as the present dynamic flash memory device has a structure that satisfies the condition that the holes 9 generated through an impact ionization phenomenon are retained in the semiconductor base material 7. To this end, it is acceptable as long as the semiconductor base material 7 has a floating body structure isolated from the substrate 1. Accordingly, even when the semiconductor base material of the semiconductor base material is formed horizontally on the substrate 1 using the GAA (Gate All Around; for example, see E. Yoshida: "A Capacitorless 1T-DRAM Technology Using Gate-induced Drain-Leakage (GIDL) Current for Low-power and High-speed Embedded Memory," IEEE IEDM (2006)) technology, which is one of SGTs, or the nanosheet technology (for example, see J. Y. Song, W. Y. Choi, J. H. Park, J. D. Lee, and B G. Park: "Design Optimization of Gate-All-Around (GAA) MOSFETs," IEEE Trans. Electron Devices, vol. 5, no. 3, pp. 186-191, May 2006), for example, the aforementioned dynamic flash memory operation can be performed. Alternatively, a device structure using SOI (Silicon On Insulator; for example, see J. Wan, L. Rojer, A. Zaslavsky, and S. Critoloveanu: "A Compact Capacitor-Less High-Speed DRAM Using Field Effect-Controlled Charge Regeneration," Electron Device Letters, Vol. 35, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond," IEEE IEDM (2006), and E. Yoshida: "A Capacitorless 1T-DRAM Technology Using Gate-induced Drain-Leakage (GIDL) Current for Low-power and High-speed Embedded Memory," IEEE IEDM (2006)) may also be used. In such a device structure, the bottom of the semiconductor base material is in contact with an insulating layer of a SOI substrate, and the semiconductor base material is surrounded by a gate insulating layer and device isolation insulating layers together with other semiconductor base materials. Even in such a structure, the semiconductor base material has a floating body structure. In this manner, it is acceptable as long as the dynamic flash memory device provided by the present embodiment satisfies the condition that its semiconductor base material has a floating body structure. Further, even with a structure in which a Fin transistor (for example, see H. Jiang, N. Xu, B. Chen, L. Zeng1, Y. He, G. Du, X. Liu and X. Zhang: "Experimental investigation of self-heating effect (SHE) in multiple-fin SOI FinFETs," Semicond. Sci. Technol. 29 (2014) 115021 (7 pp)) is formed on a SOI substrate, the present dynamic flash operation can be performed as long as its semiconductor base material has a floating body structure.

To write "1," it is also possible to generate electron-hole pairs using a GIDL (Gate Induced Drain Leakage) current (for example, see E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, Vol. 53, No. 4, pp. 692-69, April 2006), and then fill the semiconductor base material 7 with the generated holes.

Expressions (1) to (12) in the present specification and drawings are only used to qualitatively describe phenomena. Thus, such expressions are not intended to limit the phenomena.

Although each of the reset voltages of the word line WL, the bit line BL, and the source line SL is indicated by Vss in the description made with reference to FIGS. 3AA, 3AB, 3AC and 3B, the reset voltages may be different voltages.

In FIG. 4A, exemplary conditions of a page erase operation have been illustrated. In contrast, it is also possible to change the voltage applied to each of the source line SL, the plate line PL, the bit line BL, and the word line WL as long as the state of removing the holes 9 in the semiconductor base material 7 from one or both of the $N^+$ layer 3a and the $N^+$ layer 3b is achieved. In addition, in a page erase operation, it is also possible to apply a voltage to the source line SL and bring the bit line BL into a floating state in the selected page. Alternatively, in a page erase operation, it is also possible to apply a voltage to the bit line BL and bring the source line SL into a floating state in the selected page.

In FIG. 1, in a portion of the semiconductor base material 7 surrounded by the insulating layer 6 as the first insulating layer in the vertical direction, potential distributions of the first semiconductor base material 7a and the second semiconductor base material 7b are formed continuously. Accordingly, the semiconductor base material 7 including the first semiconductor base material 7a and the second semiconductor base material 7b is continuous in the vertical direction across its region surrounded by the insulating layer 6 as the first insulating layer.

It should be noted that in FIG. 1, it is desirable that the length in the vertical direction of the first gate conductor layer 5a connecting to the plate line PL be made further longer than the length in the vertical direction of the second gate conductor layer 5b connecting to the word line WL so that $C_{PL}>C_{WL}$. However, it is possible to reduce the capacitive coupling ratio ($C_{WL}/(C_{PL}+C_{WL}+C_{BL}+C_{SL})$) of the word line WL to the semiconductor base material 7 only by adding the plate line PL. Consequently, potential fluctuation $\Delta V_{FB}$ of the semiconductor base material 7 as the floating body becomes small.

In addition, as the voltage $V_{PLL}$ of the plate line PL, a fixed voltage of 2 V may be applied, for example, in each operation mode other than an operation mode in which selective erasing is performed through a per-block erase operation.

It should be noted that the term "cover" as included in the following phrase: "the gate insulating layer, the gate conductor layer, or the like covers the channel or the like" in the present specification and claims includes a case where the channel or the like is entirely covered as in a SGT or a GAA, a case where the channel or the like is partially covered as in a Fin transistor, and a case where the channel or the like overlaps a planar object as in a planar transistor.

In addition, in FIG. 1, the first gate conductor layer 5a may be split into two or more gate conductor layers as seen in plan view or in the vertical direction, and the resulting two or more gate conductor layers may be operated as conductor electrodes for the plate line synchronously or asynchronously and with the same drive voltage or different drive voltages. Similarly, the second gate conductor layer 5b may be split into two or more gate conductor layers as seen in plan view or in the vertical direction, and the resulting two or more gate conductor layers may be operated as conductor electrodes for the word line synchronously or asynchronously and with the same drive voltage or different drive voltages. Even with such a structure, the dynamic flash memory operation can be performed. When the first gate conductor layer 5a is split into two or more gate conductor layers, at least one of the resulting gate conductor layers of the first gate conductor layer performs the role of the aforementioned first gate conductor layer 5a. Regarding the second gate conductor layer 5b split into two or more gate conductor layers also, at least one of the resulting gate conductor layers of the second gate conductor layer performs the role of the aforementioned second gate conductor layer 5b. In addition, the split gate conductor layers of one of the first gate conductor layer 5a and the second gate conductor layer 5b may be arranged on the opposite sides of the other of the first gate conductor layer 5a or the second gate conductor layer 5b in the vertical direction.

The aforementioned conditions of the voltages applied to the bit line BL, the source line SL, the word line WL, and the plate line PL as well as the voltage of the floating body are only examples for performing the basic operation including an erase operation, a write operation, and a read operation. Thus, other voltage conditions may also be employed as long as the basic operation of the present invention can be performed.

It is also possible to provide a junctionless structure in which each of the $N^+$ layers 3a and 3b and the semiconductor base material of the P layer 7 in the dynamic flash memory cell illustrated in FIG. 1 has the same conductivity type. This is also true of the other embodiments.

The present embodiment has the following features.

(Feature 1)

In the dynamic flash memory cell of the present embodiment, the $N^+$ layers 3a and 3b serving as the source and the drain, the semiconductor base material 7, the first gate insulating layer 4a, the second gate insulating layer 4b, the first gate conductor layer 5a, and the second gate conductor layer 5b are formed in a pillar shape as a whole. In addition, the $N^+$ layer 3a serving as the source connects to the source line SL, the $N^+$ layer 3b serving as the drain connects to the bit line BL, the first gate conductor layer 5a connects to the plate line PL, and the second gate conductor layer 5b connects to the word line WL. The dynamic flash memory cell has such a structure that the gate capacitance of the first gate conductor layer 5a connecting to the plate line PL is larger than the gate capacitance of the second gate conductor layer 5b connecting to the word line WL. In the present dynamic flash memory cell, the first gate conductor layer and the second gate conductor layer are stacked in the vertical direction. Therefore, even though the dynamic flash memory cell has such a structure that the gate capacitance of the first gate conductor layer 5a connecting to the plate line PL is larger than the gate capacitance of the second gate conductor layer 5b connecting to the word line WL, an increase in the memory cell area as seen in plan view can be avoided. Accordingly, higher performance and a higher degree of integration of the dynamic flash memory cell can be achieved at the same time.

(Feature 2)

When a page erase operation is performed on the dynamic flash memory cell according to the first embodiment of the present invention, one or both of the voltage of the first gate conductor layer 5a connecting to the plate line PL and the voltage of the second gate electrode 5b connecting to the word line WL changes from a low level to a high level. Thus, due to capacitive coupling with the semiconductor base material 7, one or both of a P-N junction between the source $N^+$ layer 3a and the semiconductor base material 7 and a P-N junction between the drain $N^+$ layer 3b and the semiconductor base material 7 is/are forward-biased, and the holes 9 in the semiconductor base material 7 are discharged to the source $N^+$ layer 3a and/or the drain $N^+$ layer 3b.

(Feature 3)

Following the operation described in (Feature 2) of the dynamic flash memory cell according to the first embodiment of the present invention, one or both of the voltage of the first gate conductor layer 5a connecting to the plate line PL and the voltage of the second gate conductor layer 5b connecting to the word line WL returns from the high level to the low level. Thus, due to capacitive coupling with the semiconductor base material 7 again, the voltage of the semiconductor base material 7 is negatively biased. In this manner, it is possible to negatively bias the voltage of the semiconductor base material 7 in the "0" erase state without applying a negative bias to the source $N^+$ layer 3a or the drain $N^+$ layer 3b. This eliminates the need for a double-structure well or a negative-bias generation circuit for applying a negative bias, and thus can simplify the design of a memory core and a peripheral circuit as well as a process therefor.

(Feature 4)

A focus is now placed on the role of the first gate conductor layer 5a, which connects to the plate line PL, of the dynamic flash memory cell according to the first embodiment of the present invention. The voltage of the word line WL oscillates up and down while a write operation or a read operation is performed on the dynamic flash memory cell. At this time, the plate line PL performs the role of reducing the capacitive coupling ratio between the word line WL and the semiconductor base material 7. Consequently, it is possible to significantly suppress the influence of changes in the voltage of the semiconductor base material 7 when the voltage of the word line WL oscillates up and down. Accordingly, it is possible to increase the difference between the threshold voltages of the SGT transistor of the word line WL corresponding to logic levels of "0" and "1." This leads to an increased operation margin of the dynamic flash memory cell. In addition, in reading data, setting the voltage applied to the first gate conductor layer 5a connecting to the plate line PL to be higher than the threshold voltage corresponding to the logical memory data "1" and lower than the threshold voltage corresponding to the logical memory data "0" can obtain such characteristics that no current flows even when the voltage of the word line WL is set high. This leads to a further increased operation margin of the dynamic flash memory cell.

(Feature 5)

In the dynamic flash memory cell of the first embodiment, the page erase operation described with reference to FIGS. 4A to 4ED is performed, but rewriting is performed with an electric field significantly lower than that in a typical flash memory. Therefore, there is no need to limit the number of times of rewriting for page erase operations from the perspective of reliability.

Other Embodiments

Although Si pillars are formed in the present invention, it is also possible to form semiconductor pillars of a semiconductor material other than Si. This is also true of the other embodiments according to the present invention.

In a vertical NAND flash memory circuit, a plurality of memory cells, each including a semiconductor pillar as a channel and also including a tunnel oxide layer, a charge storage layer, an interlayer dielectric layer, and a control conductor layer surrounding the semiconductor pillar, are formed in the vertical direction. A source-line impurity region corresponding to a source and a bit-line impurity region corresponding to a drain are provided at opposite ends of the semiconductor pillar in each memory cell. In addition, if one of memory cells on the opposite sides of a single memory cell serves the role of a source, the other serves the role of a drain. As described above, the vertical NAND flash memory circuit is one of SGT circuits. Thus, the present invention is also applicable to a mixed circuit including a NAND flash memory circuit.

When writing "1," it is also possible to generate electron-hole pairs through an impact ionization phenomenon using a gate induced drain leakage (GIDL) current described in E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, Vol. 53, No. 4, pp. 692-69, April 2006, and then fill the floating body FB with the generated holes. This is also true of the other embodiments according to the present invention.

In FIG. 1, the dynamic flash memory operation can also be performed with a structure obtained by reversing the polarity of the conductivity type of each of the $N^+$ layers $3a$ and $3b$ and the Si pillar 2 as the P-layer. In such a case, the majority carriers in the n-type Si pillar 2 are electrons. Thus, electrons generated through impact ionization are stored in the semiconductor base material 7, and the semiconductor base material 7 is thus set to the state "1."

In FIG. 1, the first gate conductor layer $5a$ may connect to the word line WL, and the second gate conductor layer $5b$ may connect to the plate line PL. Even with such a structure, the present dynamic flash memory operation described above can be performed.

The present invention can be implemented in various embodiments and modifications without departing from the broad spirit and scope of the present invention. In addition, each of the aforementioned embodiments only describes an example of the present invention and is not intended to limit the scope of the present invention. The aforementioned examples and modified examples can be combined as appropriate. Further, even if some of the components of the aforementioned embodiments are removed as necessary, the resulting structure is within the technical idea of the present invention.

INDUSTRIAL APPLICABILITY

With the memory apparatus using the semiconductor devices according to the present invention, it is possible to obtain dynamic flash memory that is a memory apparatus using high-density and high-performance semiconductor devices.

What is claimed is:

1. A memory apparatus using semiconductor devices, comprising:
a page including a plurality of memory cells arranged in a column on a substrate,
wherein:
each memory cell included in the page has
a semiconductor base material provided on the substrate in a manner standing in an upright position along a vertical direction or extending in a horizontal direction with respect to the substrate,
a first impurity region and a second impurity region at opposite ends of the semiconductor base material,
a gate insulating layer in contact with a side face of the semiconductor base material between the first impurity region and the second impurity region,
a first gate conductor layer partially or entirely covering the gate insulating layer, and
a second gate conductor layer adjacent to the first gate conductor layer and in contact with a side face of the gate insulating layer,
in each of the individual memory cells,
each of voltages applied to the first gate conductor layer, the second gate conductor layer, the first impurity region, and the second impurity region is controlled to allow holes generated through an impact ionization phenomenon or using a gate induced drain leakage current to be retained in the semiconductor base material, and
during a page write operation, a voltage of the semiconductor base material is set to a first data holding voltage that is higher than one or both of a voltage of the first impurity region and a voltage of the second impurity region, and
in all of the individual memory cells forming the page,
during a page erase operation,
the voltage of the semiconductor base material is controlled to a voltage higher than the first data holding voltage through one or both of first capacitive coupling between the first gate conductor layer and the semiconductor base material and second capacitive coupling between the second gate conductor layer and the semiconductor base material, and until the voltage of the semiconductor base material has become higher than one or both of the voltage of the first impurity region and the voltage of the second impurity region, the holes are removed from the semiconductor base material through one or both of the first impurity region and the second impurity region, and
the voltage of the semiconductor base material is set to a second data holding voltage lower than the first data holding voltage through the first capacitive coupling and the second capacitive coupling.

2. The memory apparatus using the semiconductor devices according to claim 1,
wherein:
during the page erase operation,
a voltage of the first gate conductor layer is changed from a first voltage to a second voltage higher than the first voltage, or a voltage of the second gate conductor layer is changed from a third voltage to a fourth voltage higher than the third voltage,
in a first period, the voltage of the semiconductor base material is controlled to a voltage higher than the first data holding voltage through the first capacitive coupling and the second capacitive coupling,
in a second period, the holes are pulled out from the semiconductor base material through one or both of the first impurity region and the second impurity region until the voltage of the semiconductor base material has become higher than one or both of the voltage of the first impurity region and the voltage of the second impurity region by a built-in voltage, and
in a third period, the voltage of the semiconductor base material is set to the second data holding voltage lower than the first data holding voltage through the first capacitive coupling and the second capacitive coupling.

3. The memory apparatus using the semiconductor devices according to claim 1, wherein when the page erase operation is performed on the page including the plurality of semiconductor base materials arranged in a column, the page erase operation is concurrently performed on all of the semiconductor base materials included in the page.

4. The memory apparatus using the semiconductor devices according to claim 1, wherein an inversion layer is not formed in the semiconductor base material in a part of or an entirety of the first period and the second period in which the voltage of the semiconductor base material is changed using one or both of the first capacitive coupling and the second capacitive coupling based on voltages applied to the first impurity region and the second impurity region.

5. The memory apparatus using the semiconductor devices according to claim 1, wherein a first gate capacitance between the first gate conductor layer and the semiconductor base material is set larger than a second gate capacitance between the second gate conductor layer and the semiconductor base material.

6. The memory apparatus using the semiconductor devices according to claim 1, wherein the holes are removed from the semiconductor base material through one of the first impurity region or the second impurity region, and another of the first impurity region or the second impurity region is set to a floating state.

7. A memory apparatus using semiconductor devices, comprising a block having arranged therein a plurality of pages each corresponding to the page of the memory apparatus according to claim 1,
wherein:
the first impurity region in the memory cell included in each of the plurality of pages connects to a source line, the second impurity region connects to a bit line, one of the first gate conductor layer and the second gate conductor layer connects to a word line, and another of the first gate conductor layer and the second gate conductor layer connects to a first drive control line,
the source line is connected in common to the semiconductor base materials in the block, and
the page erase operation is performed by removing the holes in all of the semiconductor base materials in the selected page in the block based on each of voltages applied to the source line, the bit line, the first drive control line, and the word line.

8. The memory apparatus using the semiconductor devices according to claim 7, wherein the page erase operation is performed by removing the holes in all of the semiconductor base materials in the plurality of selected pages in the block.

9. The memory apparatus using the semiconductor devices according to claim 1, wherein one or both of the first gate conductor layer and the second gate conductor layer is/are split into two or more split gate conductor layers as seen in plan view or in the vertical direction, and the split two or more gate conductor layers are operated synchronously or asynchronously.

10. The memory apparatus using the semiconductor devices according to claim 9, wherein the split gate conductor layers of one of the first gate conductor layer and the second gate conductor layer are arranged on opposite sides of another of the first gate conductor layer or the second gate conductor layer in the vertical direction.

* * * * *